United States Patent
Ihn et al.

(10) Patent No.: US 8,865,860 B2
(45) Date of Patent: *Oct. 21, 2014

(54) ELECTRON DONATING POLYMER AND SOLAR CELL INCLUDING THE SAME

(75) Inventors: Soo-Ghang Ihn, Hwaseong-si (KR); Yeong Suk Choi, Suwon-si (KR); Sungyoung Yun, Suwon-si (KR); Younhee Lim, Seoul (KR); Bulliard Xavier, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 107 days.

This patent is subject to a terminal disclaimer.

(21) Appl. No.: 13/477,850

(22) Filed: May 22, 2012

(65) Prior Publication Data

US 2012/0298193 A1 Nov. 29, 2012

(30) Foreign Application Priority Data

May 23, 2011 (KR) .................. 10-2011-0048514
May 16, 2012 (KR) .................. 10-2012-0052165

(51) Int. Cl.
*C08G 75/00* (2006.01)
*H01B 1/12* (2006.01)
*C09B 69/10* (2006.01)
*H01L 51/00* (2006.01)
*C08G 61/12* (2006.01)
*B82Y 10/00* (2011.01)
*H01L 51/42* (2006.01)

(52) U.S. Cl.
CPC ............ *H01L 51/0036* (2013.01); *H01B 1/127* (2013.01); *C09B 69/109* (2013.01); *C08G 2261/91* (2013.01); *Y02E 10/549* (2013.01); *C08G 2261/146* (2013.01); *H01L 51/4253* (2013.01); *C08G 2261/414* (2013.01); *C08G 2261/1426* (2013.01); *C08G 2261/3243* (2013.01); *H01L 51/0043* (2013.01); *C08G 61/126* (2013.01); *B82Y 10/00* (2013.01); *H01L 51/0047* (2013.01)
USPC ......................................... 528/377; 528/380

(58) Field of Classification Search
CPC ............................................... C08G 2261/1426
USPC ................................................. 528/377, 380
See application file for complete search history.

(56) References Cited

U.S. PATENT DOCUMENTS

| | | | |
|---|---|---|---|
| 4,125,414 A | 11/1978 | Tang et al. | |
| 4,175,981 A | 11/1979 | Loutfy et al. | |
| 4,329,535 A | 5/1982 | Rapp | |
| 4,356,429 A | 10/1982 | Tang | |
| 4,913,744 A | 4/1990 | Hoegl et al. | |
| 6,913,710 B2 | 7/2005 | Farrand et al. | |
| 7,071,289 B2 | 7/2006 | Sotzing | |
| 7,118,692 B2 | 10/2006 | Nordquist et al. | |
| 7,147,936 B2 | 12/2006 | Louwet et al. | |
| 7,183,418 B2 | 2/2007 | Heeney et al. | |
| 7,244,809 B2 | 7/2007 | Giles et al. | |
| 7,432,340 B2 | 10/2008 | Zahn et al. | |
| 7,470,377 B2 | 12/2008 | Heeney et al. | |
| 7,507,764 B2 | 3/2009 | Hirsch | |
| 7,524,922 B2 | 4/2009 | Heeney et al. | |
| 7,541,425 B2 | 6/2009 | Heeney et al. | |
| 7,572,879 B2 | 8/2009 | Zahn et al. | |
| 7,667,230 B2 | 2/2010 | Zhu et al. | |
| 7,700,643 B2 | 4/2010 | Heeney et al. | |
| 7,714,098 B2 | 5/2010 | Heeney et al. | |
| 7,754,847 B2 | 7/2010 | Chan et al. | |
| 7,781,673 B2 | 8/2010 | Gaudiana et al. | |
| 7,838,624 B2 | 11/2010 | Laird et al. | |

(Continued)

FOREIGN PATENT DOCUMENTS

EP   1 916 250   4/2008
JP   2009-060051 A   3/2009

(Continued)

OTHER PUBLICATIONS

European Search Report dated Oct. 12, 2011, in corresponding European Patent Application No. 11171285.7.

(Continued)

*Primary Examiner* — Shane Fang
(74) *Attorney, Agent, or Firm* — Harness, Dickey & Pierce, P.L.C.

(57) ABSTRACT

An electron donating polymer including moiety A represented by Chemical Formula 1,

[Chemical Formula 1]

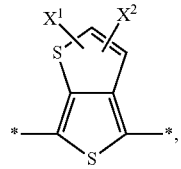

and a solar cell including the electron donating polymer are provided. In Chemical Formula 1, $X^1$ is a functional group including at least two ester residual groups and a substituted or unsubstituted divalent aliphatic organic group linking the ester residual groups, and $X^2$ is one of hydrogen, a halogen atom, a substituted or unsubstituted $C_1$ to $C_{20}$ aliphatic group, a hydroxy group, a substituted or unsubstituted $C_1$ to $C_{20}$ alkoxy group, a substituted or unsubstituted $C_1$ to $C_{30}$ ketone group, a substituted or unsubstituted $C_1$ to $C_{20}$ ester group, a thiol group, —$SR^{100}$ (wherein $R^{100}$ is one of a substituted or unsubstituted $C_1$ to $C_{20}$ aliphatic group, a substituted or unsubstituted $C_2$ to $C_{30}$ aromatic group, and a substituted or unsubstituted $C_2$ to $C_{30}$ heterocycloalkyl group), and a combination thereof.

25 Claims, 17 Drawing Sheets

(56) References Cited

U.S. PATENT DOCUMENTS

| | | |
|---|---|---|
| 2005/0022856 A1 | 2/2005 | Komatsu et al. |
| 2005/0061364 A1 | 3/2005 | Peumans et al. |
| 2005/0143327 A1 | 6/2005 | Hirsch |
| 2006/0289058 A1 | 12/2006 | Skabara et al. |
| 2008/0087326 A1 | 4/2008 | Scholes et al. |
| 2008/0102559 A1 | 5/2008 | Ong et al. |
| 2008/0103286 A1 | 5/2008 | Ong et al. |
| 2008/0154019 A1 | 6/2008 | Hwang et al. |
| 2008/0213324 A1 | 9/2008 | Zhou et al. |
| 2008/0315751 A1 | 12/2008 | Sheina et al. |
| 2009/0221740 A1 | 9/2009 | Sheina |
| 2009/0299029 A1 | 12/2009 | Chan et al. |
| 2010/0006154 A1 | 1/2010 | Kitazawa et al. |
| 2010/0032018 A1 | 2/2010 | Zhu et al. |
| 2010/0243051 A1 | 9/2010 | Slager |
| 2010/0292433 A1 | 11/2010 | Chen et al. |
| 2011/0006287 A1 | 1/2011 | You et al. |
| 2011/0017956 A1 | 1/2011 | Hou et al. |
| 2011/0114159 A1 | 5/2011 | Smith et al. |
| 2011/0315224 A1 | 12/2011 | Choi et al. |
| 2011/0315225 A1* | 12/2011 | Choi et al. ............ 136/263 |
| 2013/0087202 A1* | 4/2013 | Ihn et al. ............ 136/263 |

FOREIGN PATENT DOCUMENTS

| | | |
|---|---|---|
| KR | 10-0872957 B | 12/2008 |
| KR | 2011-0140525 A | 1/2012 |
| KR | 2011-0140552 A | 1/2012 |
| WO | WO-2009/051275 A1 | 4/2009 |
| WO | WO-2009/052215 A1 | 4/2009 |
| WO | WO-2009/104781 A1 | 8/2009 |
| WO | WO-2009/152165 A2 | 12/2009 |
| WO | WO-2010/008672 A1 | 1/2010 |
| WO | WO-2010/136401 A2 | 12/2010 |
| WO | WO 2012/003919 A2 | 1/2012 |

OTHER PUBLICATIONS

European Search Report dated Sep. 17, 2012, in corresponding European Patent Application No. 12168879.0.

Hou, J., et al. "Synthesis of a Low Band Gap Polymer and Its Application in Highly Efficient Polymer Solar Cells." J. Am. Chem. Soc. 2009, 131, 15586-15587, XP-002660031.

Huo, L., et al. "Replacing Alkoxy Groups with Alkylthienyl Groups: A Feasible Approach to Improve the Properties of Photovoltaic Polymers," Angewandte Chemie International Edition, vol. 50, No. 41, pp. 9697 to 9702 (Oct. 4, 2011).

Kim, K.-J., et al."Passivation films with SU-8 polymers for organic solar cell protection from ultraviolet ray", Solar Energy Materials and Solar Cells, vol. 95, pp. 1238-1242, Feb. 3, 2011.

Liang, Y., et al., "For the Bright Future—Bulk Heterojunction Polymer Solar Cells with Power Conversion Efficiency of 7.4%", Adv. Mater. 2010, pp. E135-E138, Jan. 4, 2010.

Yamamoto, T., et al., "Synthesis and Characterization of Thieno[3,4-b]thiophene-Based Copolymers Bearing 4-Substituted Phenyl Ester Pendants: Facile Fine-Tuning of HOMO Energy Levels," Macromolecules, vol. 44, No. 17, pp. 6659-6662, (Sep. 13, 2011).

Kleinhenz, N., et al., "Low-Band Gap Polymers That Utilize Quinoid Resonance Structure Stabilization by Thienothiophene: Fine-Tuning of HOMO level," Macromolecules, vol. 44, No. 4, pp. 872-877 (Feb. 22, 2011).

Liang, Yongye, et al. "Highly Efficient Solar Cell Polymers Developed via Fine-Tuning of Structural and Electronic Properties." J. Am. Chem. Soc. 2009, 131, 7792-7799, XP-002660032.

Peet, J., et al., "Efficiency enhancement in low-bandgap polymer solar cells by processing with alkane dithols", nature materials, vol. 6 Jul. 2007, pp. 497-500, May 27, 2007.

Ryu, M.-S., et al. "Improvement of operation lifetime for conjugated polymer:fullerene organic solar cells by introducing a UV absorbing film", Solar Energy Materials & Solar Cells, vol. 94, pp. 152-156, Sep. 4, 2009.

Zilio, S.D., et al., "Fabrication of a light trapping system for organic solar cells", Microelectronic Engineering, vol. 86, pp. 1150-1154, Feb. 11, 2009.

Scharber, M. C. et al., "Design Rules for Donors in Bulk-Heterojunction Solar Cells—Towards 10% Energy-Conversion Efficiency", Advanced Materials, 2006, vol. 18, pp. 789-794.

Wynberg, H. et al., "Synthesis of an Asymmetric Heterotriptycene", The Journal of Organic Chemistry, vol. 35, No. 3, Mar. 1970, pp. 711-715.

Pomerantz, M. and Gu, X., "Poly(2-decylthieno[3,4-b]thiophene). A New Soluble Low-Bandgap Conducting Polymer", Synthetic Metals, vol. 84, 1997, pp. 243-244.

C.W. Tang; "Two-layer organic photovoltaic cell"; Applied Physics Letters, vol. 48, pp. 183-185, 1986.

"Perylene Spec Sheet"; LookChem.com; 2008 <http://www.lookchem.com/cas-198/198-55-0.html>.

"Tetraphenylbutadiene Spec Sheet"; LookChem.com; 2008 <http://www.lookchem.com/1-1-4-4-Tetraphenylbutadiene/>.

S. Prahl; "Coumarin Absorption/Emission Spectra"; Oregon Medical Laser Center; Mar. 2012; <http://omlc.ogi.edu/spectra/PhotochemCAD/html/045.html>.

V. Gehman, et al.; "Fluorescence efficiency and visible re-emission spectrum of tetraphenyl butadiene films at extreme ultraviolet wavelengths"; Nuclear Instruments and Methods in Physics Research Section A: Accelerators, Spectrometers, Detectors, and Associated Equipment, vol. 654, p. 116-121; 2011.

"Dhanveen Pigments Copper Phthalocyanine Spec Sheet"; Dhanveen Pigments Pvt.Ltd.; 2013; <http://www.dhanveenpigments.com/copper-phthalocyanine-crude-cpc-blue--306522.html>.

F. Saunders, "Crystalline poly-p-tert-butylstyrene"; Journal of Polymer Science Part A-1, vol. 5; 1967.

Office Action dated Feb. 27, 2014 for co-pending U.S. Appl. No. 13/371,933.

Liang et al., "Development of New Semiconducting Polymers for High Performance Solar Cell", J. Am. Chem. Soc., 2009, 131, pp. 56-57, and supplemental information.

Sajadi et al., "Time-resolved fluorescence spectra of cis-stilbene in hexane and acetonitrile", Chemical Physics Letters, 489 (2010), pp. 44-47.

Evidentiary reference Prahl, "Absorption and Emission Spectra for Trans-stilbene", 2013.

Wu et al., "An ultraviolet responsive hybrid solar cell based on titania/Poly (3-hexylthiophene", Scientific Reports 3: 1283, Feb. 15, 2013, pp. 1-6.

US Office Action dated Jul. 31, 2013 corresponding to U.S. Appl. No. 13/371,933.

Office Action issued in corresponding U.S. Appl. No. 13/166,435 on Apr. 8, 2014.

Advisory Action and Interview Summary dated Jun. 19, 2014 issued in co-pending U.S. Appl. No. 13/371,933.

* cited by examiner

ELECTRON DONATING POLYMER AND SOLAR CELL INCLUDING THE SAME

CROSS-REFERENCE TO RELATED APPLICATION

This application claims priority to and the benefit of Korean Patent Application No. 10-2011-0048514 filed in the Korean Intellectual Property Office on May 23, 2011 and No. 10-2012-0052165 filed in the Korean Intellectual Property Office on May 16, 2012, the entire contents of which are incorporated herein by reference.

BACKGROUND

1. Field

Example embodiments relate to an electron donating polymer and a solar cell including the same.

2. Description of the Related Art

A solar cell is a photoelectric conversion device that transforms solar energy into electrical energy, and has attracted much attention as an infinite but pollution-free next generation energy source.

A solar cell includes p-type and n-type semiconductors and produces electrical energy by transferring electrons and holes to the n-type and p-type semiconductors, respectively, and then collecting electrons and holes in each electrode when an electron-hole pair (EHP) is produced by solar light energy absorbed in a photoactive layer inside the semiconductors.

A solar cell may be classified into an inorganic solar cell and an organic solar cell depending on a material included in a thin layer. The organic solar cell may be classified into a bi-layer p-n junction structure in which a p-type semiconductor is formed in a separate layer from an n-type semiconductor, and a bulk heterojunction structure in which a p-type semiconductor is mixed with an n-type semiconductor.

SUMMARY

Example embodiments provide a polymer being capable of absorbing light with a wider wavelength region, being dissolved in an organic solvent more easily, and having improved miscibility with an electron acceptor. Example embodiments also provide a solar cell including the polymer.

According to example embodiments, a polymer may include a moiety A represented by the Chemical Formula 1:

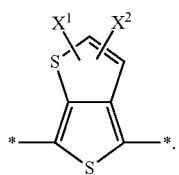

[Chemical Formula 1]

In Chemical Formula 1, $X^1$ is a functional group including at least two ester residual groups and a substituted or unsubstituted divalent aliphatic group linking the ester residual groups, and $X^2$ is one of hydrogen, a halogen atom, a substituted or unsubstituted $C_1$ to $C_{20}$ aliphatic group, a hydroxy group, a substituted or unsubstituted $C_1$ to $C_{20}$ alkoxy group, a substituted or unsubstituted $C_1$ to $C_{30}$ ketone group, a substituted or unsubstituted $C_1$ to $C_{20}$ ester group, a thiol group, $-SR^{100}$ (wherein $R^{100}$ is one of a substituted or unsubstituted $C_1$ to $C_{20}$ aliphatic group, a substituted or unsubstituted $C_2$ to $C_{30}$ aromatic group, and a substituted or unsubstituted $C_2$ to $C_{30}$ heterocycloalkyl group), and a combination thereof.

The $X^1$ may be a functional group represented by the Chemical Formula 1A or 1B:

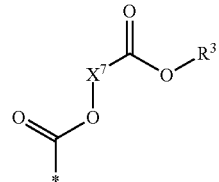

[Chemical Formula 1A]

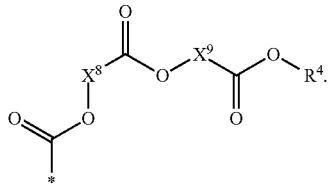

[Chemical Formula 1B]

In Chemical Formula 1A or 1B, each of $X^7$ to $X^9$ are the same or different and are independently a substituted or unsubstituted divalent $C_1$ to $C_{20}$ aliphatic group, and each of $R^3$ and $R^4$ are the same or different and are independently one of hydrogen and a substituted or unsubstituted $C_1$ to $C_{20}$ aliphatic group. At least one of $X^1$ and $X^2$ may include a halogen atom.

The polymer may further include a moiety B represented by the Chemical Formula 2:

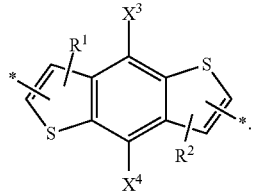

[Chemical Formula 2]

In the Chemical Formula 2, each of $X^3$ and $X^4$ are the same or different and are independently one of hydrogen, a halogen atom, a substituted or unsubstituted $C_1$ to $C_{20}$ aliphatic group, a hydroxy group, a substituted or unsubstituted $C_1$ to $C_{20}$ alkoxy group, a substituted or unsubstituted $C_1$ to $C_{20}$ ketone group, a substituted or unsubstituted $C_1$ to $C_{20}$ ester group, a thiol group, $-SR^{101}$ (wherein $R^{101}$ is one of a substituted or unsubstituted $C_1$ to $C_{20}$ aliphatic group, a substituted or unsubstituted $C_2$ to $C_{30}$ aromatic group, and a substituted or unsubstituted $C_2$ to $C_{30}$ heterocycloalkyl group), and a combination thereof.

Each of $R^1$ and $R^2$ are the same or different and are independently one of hydrogen, a substituted or unsubstituted $C_1$ to $C_{20}$ alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, an organic group including at least one of $-O-$, $-S-$, $-SO_2-$, $-CO-$, $-OCO-$, $-COO-$, $-CH=CH-$, $-C\equiv C-$, and $SiR^{102}R^{103}$ (wherein each of $R^{102}$ and $R^{103}$ are the same or different and are independently one of hydrogen, a substituted or unsubstituted $C_1$ to $C_{20}$ alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, and a combination thereof), and a combination thereof.

The moiety A and the moiety B may be included at a mole ratio of about 1:0.5 to about 1:2.5. The moiety A and the moiety B may form as a repeating unit, wherein the repeating unit may include the moiety A and the moiety B at a mole ratio of about 1:0.5 to about 1:2.5.

The moiety A and the moiety B may form a repeating unit, wherein the repeating unit may include one of a repeating unit represented by the Chemical Formula 3, a repeating unit represented by the Chemical Formula 4, and a combination thereof:

[Chemical Formula 3]

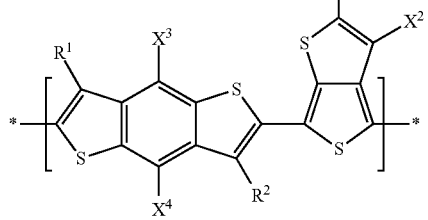

[Chemical Formula 4]

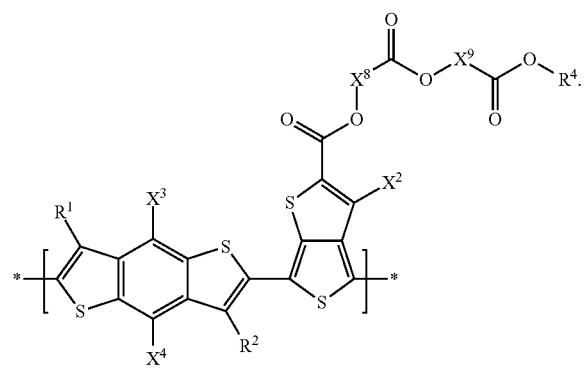

In the Chemical Formulae 3 and 4, $X^2$ is one of hydrogen, a halogen atom, a substituted or unsubstituted $C_1$ to $C_{20}$ alkyl group, and a combination thereof, each of $X^3$ and $X^4$ are the same or different and are independently one of a substituted or unsubstituted $C_1$ to $C_{20}$ alkyl group, a substituted or unsubstituted $C_1$ to $C_{20}$ alkoxy group, and —SR$^{101}$ (wherein R$^{101}$ is a substituted or unsubstituted $C_1$ to $C_{20}$ alkyl group), each of $X^7$ to $X^9$ are the same or different and are independently a substituted or unsubstituted divalent $C_1$ to $C_{10}$ aliphatic group, each of R$^1$ and R$^2$ are the same or different and are independently one of hydrogen and a substituted or unsubstituted $C_1$ to $C_{10}$ alkyl group, and each of R$^3$ and R$^4$ are the same or different and are independently one of hydrogen and a substituted or unsubstituted $C_1$ to $C_{10}$ aliphatic group.

The polymer may further include a moiety C represented by the Chemical Formula 5:

[Chemical Formula 5]

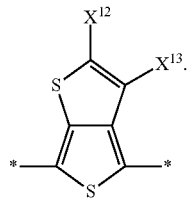

In the Chemical Formula 5, each of $X^{12}$ and $X^{13}$ are the same or different and are independently one of hydrogen, a halogen atom, a hydroxyl group, a substituted or unsubstituted $C_1$ to $C_{20}$ alkyl group, a substituted or unsubstituted $C_3$ to $C_{20}$ cycloalkyl group, a substituted or unsubstituted $C_6$ to $C_{30}$ aryl group, a substituted or unsubstituted $C_2$ to $C_{30}$ heteroaryl group, a substituted or unsubstituted $C_1$ to $C_{20}$ alkoxy group, a substituted or unsubstituted $C_1$ to $C_{30}$ ketone group, a substituted or unsubstituted $C_1$ to $C_{20}$ ester group, and a combination thereof. At least one of $X^{12}$ and $X^{13}$ may include a halogen atom.

The polymer may further include a moiety D represented by the Chemical Formula 6:

[Chemical Formula 6]

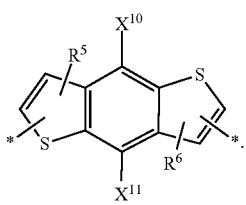

In the Chemical Formula 6, each of $X^{10}$ and $X^{11}$ are the same or different and are independently one of hydrogen, a halogen atom, a substituted or unsubstituted $C_1$ to $C_{20}$ aliphatic group, a hydroxy group, a substituted or unsubstituted $C_1$ to $C_{20}$ alkoxy group, a substituted or unsubstituted $C_1$ to $C_{20}$ ketone group, a substituted or unsubstituted $C_1$ to $C_{20}$ ester group, a thiol group, —SR$^{104}$ (wherein R$^{104}$ is one of a substituted or unsubstituted $C_1$ to $C_{20}$ aliphatic group, a substituted or unsubstituted $C_2$ to $C_{30}$ aromatic group, and a substituted or unsubstituted $C_2$ to $C_{30}$ heterocycloalkyl group), and a combination thereof.

Each of R$^5$ and R$^6$ are the same or different and are independently one of hydrogen, a substituted or unsubstituted $C_1$ to $C_{20}$ alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, an organic group including at least one of —O—, —S—, —SO$_2$—, —CO—, —OCO—, —COO—, —CH=CH—, —C≡C—, and —SiR$^{105}$R$^{106}$ (wherein each of R$^{105}$ and R$^{106}$ are the same or different and are independently one of hydrogen, a substituted or unsubstituted $C_1$ to $C_{20}$ alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, and a combination thereof), and a combination thereof.

The moiety C and the moiety D may form as a repeating unit, wherein the repeating unit may include a repeating unit represented by the Chemical Formula 7:

[Chemical Formula 7]

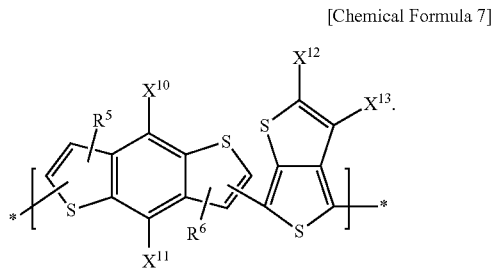

In Chemical Formula 7, each of $X^{10}$ and $X^{11}$ are the same or different and are independently one of hydrogen, and a substituted or unsubstituted $C_1$ to $C_{20}$ alkoxy group, each of $X^{12}$ and $X^{13}$ are the same or different and are independently one of hydrogen, a halogen atom, a substituted or unsubstituted $C_1$ to $C_{20}$ ketone group, and a substituted or unsubstituted $C_6$ to $C_{20}$ aryl group, and each of $R^5$ and $R^6$ are the same or different and are independently one of hydrogen, and a substituted or unsubstituted $C_1$ to $C_{20}$ alkyl group.

The polymer may include a copolymer having at least one of a repeating unit represented by the Chemical Formula 8, a repeating unit represented by the Chemical Formula 9, and a combination thereof:

are independently one of a substituted or unsubstituted $C_1$ to $C_{20}$ alkyl group, a substituted or unsubstituted $C_1$ to $C_{20}$ alkoxy group, and —$SR^{101}$ (wherein $R^{101}$ is a substituted or unsubstituted $C_1$ to $C_{20}$ alkyl group), each of $X^7$ to $X^9$ are the same or different and are independently a substituted or unsubstituted divalent $C_1$ to $C_{10}$ aliphatic group, each of $X^{10}$ and $X^{11}$ are the same or different and are independently one of hydrogen and a substituted or unsubstituted $C_1$ to $C_{20}$ alkoxy group, each of $X^{12}$ and $X^{13}$ are the same or different and are independently one of hydrogen, a halogen atom, a substituted or unsubstituted $C_1$ to $C_{30}$ ketone group, and a substituted or unsubstituted $C_6$ to $C_{30}$ aryl group, each of $R^1$ to $R^6$ are the same or different and are independently one of hydrogen and a substituted or unsubstituted $C_1$ to $C_{10}$ alkyl group, and each of x and y are a mole ratio and satisfy the following equations: $0 \leq x \leq 10$ and $0 < y \leq 10$.

At least one of $X^2$, $X^{12}$, and $X^{13}$ may include a halogen atom. The polymer may have a bandgap of about 1.2 eV to about 2.5 eV.

According to example embodiments, a solar cell may include an anode and a cathode facing each other, and a photoactive layer between the anode and the cathode and including an electron donor and an electron acceptor, wherein the electron donor includes the polymer including a moiety A represented by the Chemical Formula 1.

The polymer may further include a moiety B represented by the Chemical Formula 2. The polymer may include a repeating unit including the moiety A and the moiety B, the

[Chemical Formula 8]

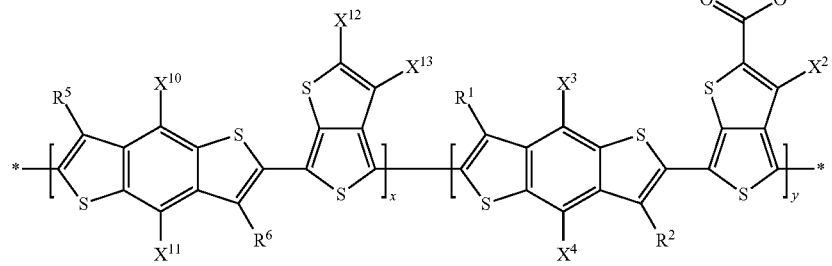

[Chemical Formula 9]

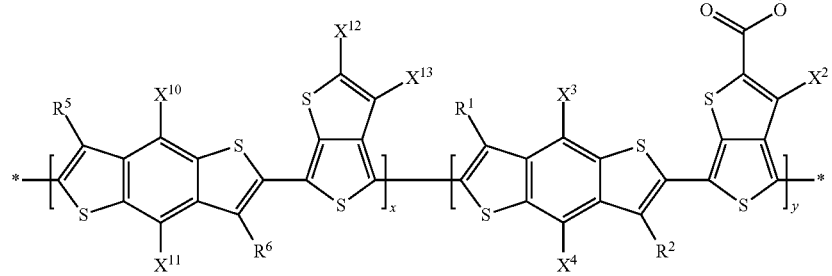

In Chemical Formulae 8 and 9, $X^2$ is one of hydrogen, a halogen atom, and a substituted or unsubstituted $C_1$ to $C_{20}$ alkyl group, each of $X^3$ and $X^4$ are the same or different and repeating unit may include a repeating unit represented by one of the Chemical Formula 3, a repeating unit represented by the Chemical Formula 4, and a combination thereof:

The polymer may further include a repeating unit represented by the Chemical Formula 7. The polymer may include a copolymer having at least one of a repeating unit represented by the Chemical Formula 8, a repeating unit represented by the Chemical Formula 9, and a combination thereof. The electron acceptor may include one of a fullerene and a derivative thereof.

The electron acceptor may include one of C60, C70, C74, C76, C78, C82, C84, C720, C860, 1-(3-methoxy-carbonyl) propyl-1-phenyl(6,6)C61 (PCBM), C71-PCBM, C84-PCBM, bis-PCBM and a combination thereof.

One of the cathode and the anode may include one of indium tin oxide (ITO), indium-doped zinc oxide (IZO), tin oxide ($SnO_2$), aluminum-doped zinc oxide (AZO), and gallium-doped zinc oxide (GZO), and the other of the cathode and the anode may include one of aluminum (Al), silver (Ag), gold (Au), and lithium (Li).

The polymer may have a number average molecular weight in a range of about 1,000 to about 800,000, for example, a range of about 2,000 to about 100,000. The polymer may have a bandgap in a range of about 1.2 eV to about 2.5 eV.

BRIEF DESCRIPTION OF THE DRAWINGS

Example embodiments will be more clearly understood from the following brief description taken in conjunction with the accompanying drawings. FIGS. 1 to 13 represent non-limiting, example embodiments as described herein.

FIG. 1 is a cross-sectional view showing a solar cell according to example embodiments.

FIGS. 2 to 4 are IR spectrums for the electron donating polymer obtained from Syntheses 1 to 3, respectively.

FIGS. 7 to 12 are TEM photographs of samples using the electron donating polymers according to Syntheses 1, 3, and 4, and Comparative Syntheses 2, 3, and 4, sequentially.

FIG. 13 is, photocurrent curves of the solar cells according to Examples 1, 3-4, and 8 and Comparative Examples 1, 2, 3, and 4.

DETAILED DESCRIPTION

Figure 1:
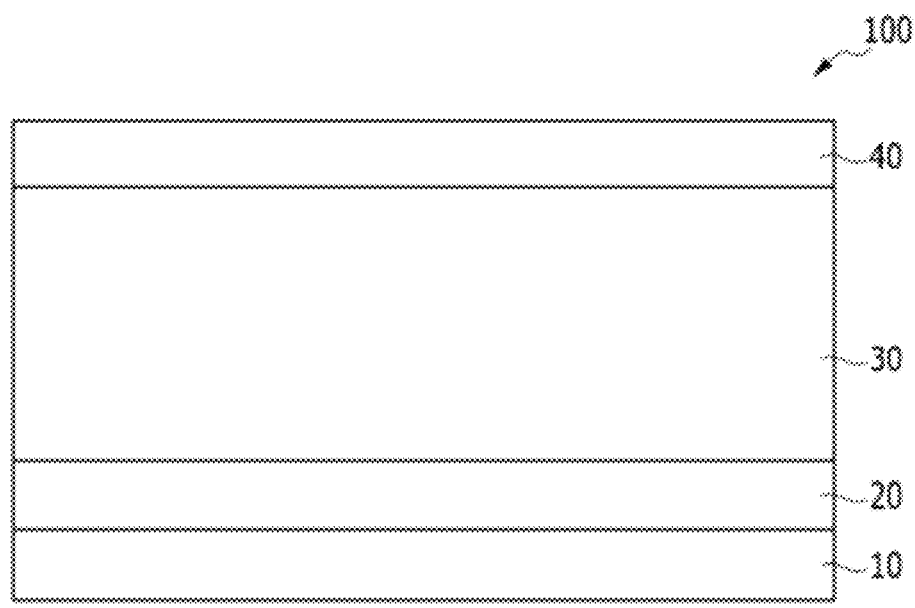

Example embodiments will hereinafter be described in further detail with reference to the accompanying drawings, in which various embodiments are shown. This disclosure may, however, be embodied in many different forms and should not be construed as limited to example embodiments set forth herein. In the drawings, the thicknesses of layers and regions are exaggerated for clarity. Like reference numerals in the drawings denote like elements, and thus their description will be omitted.

It will be understood that, although the terms "first", "second", etc. may be used herein to describe various elements, components, regions, layers and/or sections, these elements, components, regions, layers and/or sections are not to be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments are not to be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, is to be interpreted as having a meaning that is consistent with their meaning in the context of the relevant art and will not be interpreted in an idealized or overly formal sense unless expressly so defined herein.

As used herein, when a specific definition is not otherwise provided, the term "substituted" refers to one substituted with at least one substituent including a halogen (F, Br, Cl, or I), a hydroxy group, a nitro group, a cyano group, an amino group ($NH_2$, $NH(R^{200})$, or $N(R^{201})(R^{202})$, wherein each of $R^{200}$, $R^{201}$, and $R^{202}$ are the same or different, and are independently a $C_1$ to $C_{10}$ alkyl group), an amidino group, a hydrazine group, a hydrazone group, a carboxyl group, a substituted or unsubstituted alkyl group, a substituted or unsubstituted haloalkyl group, a substituted or unsubstituted alkoxy group, a substituted or unsubstituted alkenyl group, a substituted or unsubstituted alkynyl group, a substituted or unsubstituted aryl group, a substituted or unsubstituted heteroaryl group, and a substituted or unsubstituted heterocycloalkyl group in place of at least one hydrogen of a functional group.

As used herein, when a specific definition is not otherwise provided, the term "aliphatic" may refer to a $C_1$ to $C_{20}$ alkyl, a $C_2$ to $C_{20}$ alkenyl, a $C_2$ to $C_{20}$ alkynyl, a $C_1$ to $C_{20}$ alkylene, a $C_2$ to $C_{20}$ alkenylene, or a $C_2$ to $C_{20}$ alkynylene, and specifically a $C_1$ to $C_{15}$ alkyl, a $C_2$ to $C_{15}$ alkenyl, a $C_2$ to $C_{15}$ alkynyl, a $C_1$ to $C_{15}$ alkylene, a $C_2$ to $C_{15}$ alkenylene, or a $C_2$ to $C_{15}$ alkynylene, and more specifically a $C_1$ to $C_{10}$ alkyl, a $C_2$ to $C_{10}$ alkenyl, a $C_2$ to $C_{10}$ alkynyl, a $C_1$ to $C_{10}$ alkylene, a $C_2$ to $C_{10}$ alkenylene, or a $C_2$ to $C_{10}$ alkynylene, and the term "aromatic" may refer to a $C_6$ to $C_{30}$ aryl, a $C_2$ to $C_{30}$ heteroaryl, a $C_6$ to $C_{30}$ arylene, or a $C_2$ to $C_{30}$ heteroarylene, and specifically a $C_6$ to $C_{20}$ aryl, a $C_2$ to $C_{20}$ heteroaryl, a $C_6$ to $C_{20}$ arylene, or a $C_2$ to $C_{20}$ heteroarylene.

As used herein, when a specific definition is not otherwise provided, the terms "heterocycloalkyl group", "heteroaryl group", and "heteroarylene group" may independently refer to a cycloalkyl group, an aryl group, and an arylene group including at least one heteroatom of N, O, S, Si, or P and a remaining carbon in one cycle.

As used herein, when a specific definition is not otherwise provided, the term "alkyl group" may refer to a $C_1$ to $C_{20}$ alkyl group, specifically, a $C_1$ to $C_{15}$ alkyl group, and more specifically a $C_1$ to $C_{10}$ alkyl group, the term "cycloalkyl group" may refer to a $C_3$ to $C_{20}$ cycloalkyl group, specifically a $C_3$ to $C_{15}$ cycloalkyl group, and more specifically a $C_3$ to $C_{10}$ cycloalkyl group, the term "alkylene group" may refer to a $C_1$ to $C_{20}$ alkylene group, specifically a $C_1$ to $C_{15}$ alkylene group, and more specifically a $C_1$ to $C_{10}$ alkylene group, the term "alkenyl group" may refer to a $C_2$ to $C_{20}$ alkenyl group, specifically a $C_2$ to $C_{15}$ alkenyl group, and more specifically a $C_2$ to $C_{10}$ alkenyl group, the term "alkenylene group" may refer to a $C_2$ to $C_{20}$ alkenylene group, specifically a $C_2$ to $C_{15}$ alkenylene group, and more specifically a $C_2$ to $C_{10}$ alkenylene group, the term "an alkynyl group" may refer to a $C_2$ to $C_{20}$ alkynyl group, specifically a $C_2$ to $C_{15}$ alkynyl group, and more specifically a $C_2$ to $C_{10}$ alkynyl group, the term "an alkynylene group" may refer to a $C_2$ to $C_{20}$ alkynylene group, specifically a $C_2$ to $C_{15}$ alkynylene group, and more specifically a $C_2$ to $C_{10}$ alkynylene group, the term "alkoxy group" may refer to a $C_1$ to $C_{20}$ alkoxy group, specifically a $C_1$ to $C_{15}$ alkoxy group, and more specifically a $C_1$ to $C_{10}$ alkoxy group, the term "aryl group" may refer to a $C_6$ to $C_{30}$ aryl group, specifically a $C_6$ to $C_{20}$ aryl group, and more specifically a $C_6$ to $C_{15}$ aryl group, the term "heterocycloalkyl group" may refer to a $C_2$ to $C_{30}$ heterocycloalkyl group, specifically a $C_2$ to $C_{20}$ heterocycloalkyl group, and the term "halogen" refers to F, Cl, Br, or I.

As used herein, when a definition is not otherwise provided, "combination" commonly refers to mixing and/or copolymerization.

As used herein, when a definition is not otherwise provided, the term "copolymerization" refers to block copolymerization, random copolymerization, or graft copolymerization, and the term "copolymer" refers to a block copolymer, a random copolymer, or a graft copolymer.

In addition, in the specification, the mark "*" may refer to where something is connected with the same or different atom or chemical formula.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

The electron donating polymer according to example embodiments may include a moiety A represented by the Chemical Formula 1:

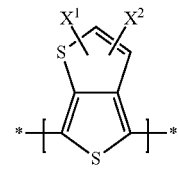

[Chemical Formula 1]

In Chemical Formula 1, $X^1$ is a functional group including at least two ester residual groups and a substituted or unsubstituted divalent aliphatic group linking the ester residual groups.

$X^2$ is one of hydrogen, a halogen atom, a substituted or unsubstituted $C_1$ to $C_{20}$ aliphatic group, a hydroxy group, a substituted or unsubstituted $C_1$ to $C_{20}$ alkoxy group, a substituted or unsubstituted $C_1$ to $C_{30}$ ketone group, a substituted or unsubstituted $C_1$ to $C_{20}$ ester group, a thiol group, —$SR^{100}$ (wherein $R^{100}$ is one of a substituted or unsubstituted $C_1$ to $C_{20}$ aliphatic group, a substituted or unsubstituted $C_2$ to $C_{30}$ aromatic group, and a substituted or unsubstituted $C_2$ to $C_{30}$ heterocycloalkyl group), and a combination thereof.

At least one of $X^1$ and $X^2$ may include a halogen atom.

Particularly, $X^1$ may include a functional group represented by the Chemical Formulae 1A or 1B:

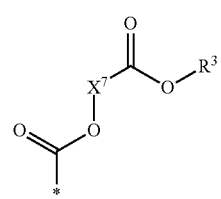

[Chemical Formula 1A]

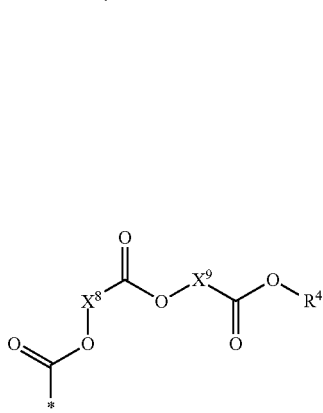

[Chemical Formula 1B]

In the Chemical Formula 1A or 1B, each of $X^7$ to $X^9$ are the same or different and are independently a substituted or unsubstituted divalent $C_1$ to $C_{20}$ aliphatic group, and each of $R^3$ and $R^4$ are the same or different and are independently one of hydrogen and a substituted or unsubstituted $C_1$ to $C_{20}$ aliphatic group.

The moiety A may include, for example, a moiety represented by the Chemical Formula 1-1, a moiety represented by the Chemical Formula 1-2, and a combination thereof.

[Chemical Formula 1-1]

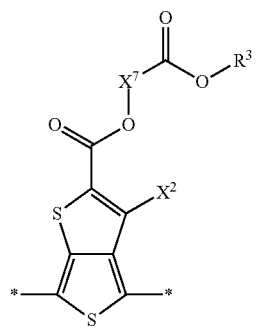

[Chemical Formula 1-2]

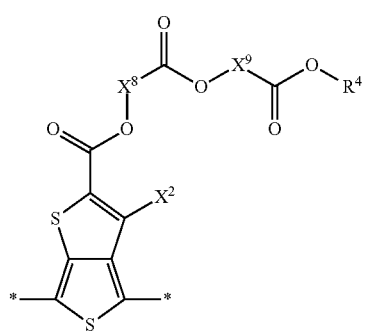

In Chemical Formula 1-1 or 1-2, $X^2$, $X^7$ to $X^9$, $R^3$ and $R^4$ are the same as described above.

The moieties represented by the Chemical Formula 1-1 and the Chemical Formula 1-2 may be synthesized in accordance with the Reaction Schemes 1 and 2, but are not limited thereto.

[Reaction Scheme 1]

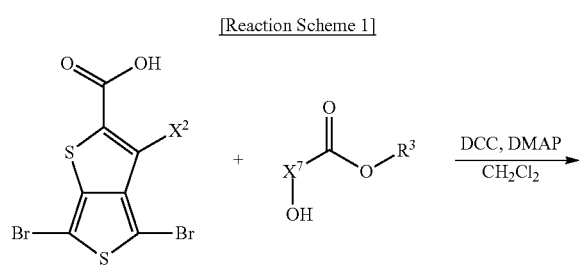

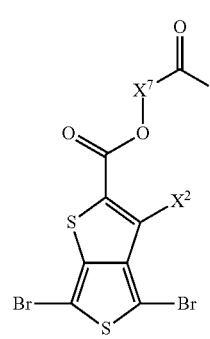

[Reaction Scheme 2]

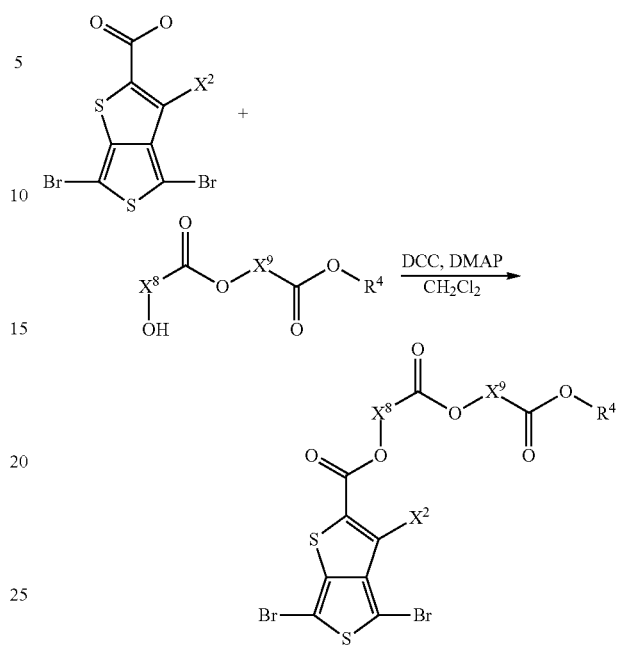

In Reaction Schemes 1 and 2, $X^2$, $X^7$ to $X^9$, $R^3$, and $R^4$ are the same as described above.

Particularly, the moiety A including the functional group represented by Chemical Formula 1A or 1B may be obtained as follows: dissolving 4,6-dibromothieno[3,4-b]thiophene-2-carboxylic acid, dicyclohexylcarbodiimide (DCC), and 4-dimethylaminopyridine (DMAP) in dichloromethane (MC), and reacting the resultant with an alkyl hydroxyalkanoate derivative represented by the Chemical Formula 1A' or the Chemical Formula 1B'.

[Chemical Formula 1A']

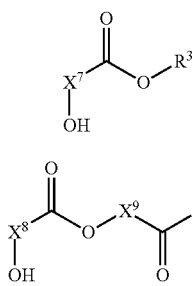

[Chemical Formula 1B']

In Chemical Formulae 1A' and 1B', $X^7$ to $X^9$, $R^3$ and $R^4$ are the same as described above.

The moiety A may be included as at least part of the electron donating polymer and form a repeating unit with another moiety. In each repeating unit, the substituents, $X^1$ and $X^2$, are the same or different.

When the electron donating polymer includes the moiety A, the compatibility with the electron acceptor may be improved. Thus, when the electron donating polymer is applied to a photoactive layer of a solar cell, the moiety A may serve as a compatibilizer improving the compatibility between the electron donating polymer and the electron acceptor.

Accordingly, a photoactive layer including the electron donating polymer and the electron acceptor may have the improved morphology, and thus, electrons and holes generated in the photoactive layer may be more easily separated and prevent or inhibit electrons and holes from recombining. As a result, the photoelectric efficiency of the solar cell may be improved.

Further, the electron donating polymer including the moiety A may have a smaller bandgap, as compared with a polymer not having the moiety A. Accordingly, the photoactive layer including the electron donating polymer having the moiety A may absorb a light with a wider wavelength region.

Particularly, because the moiety A has a functional group including at least two ester residual groups having hydrophilic property and polarity, and a substituted or unsubstituted divalent aliphatic group having hydrophobic property, the electron donating polymer including the moiety A may be dissolved in a variety of solvents, and thus, the uniformity and the coating property of the photoactive layer may be improved.

The electron donating polymer may further include a moiety B represented by the Chemical Formula 2:

[Chemical Formula 2]

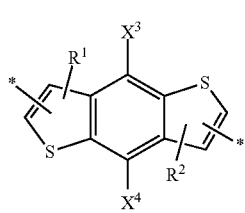

In the Chemical Formula 2, each of $X^3$ and $X^4$ are the same or different and are independently one of hydrogen, a halogen atom, a substituted or unsubstituted $C_1$ to $C_{20}$ aliphatic group, a hydroxy group, a substituted or unsubstituted $C_1$ to $C_{20}$ alkoxy group, a substituted or unsubstituted $C_1$ to $C_{20}$ ketone group, a substituted or unsubstituted $C_1$ to $C_{20}$ ester group, a thiol group, —$SR^{101}$ (wherein $R^{101}$ is one of a substituted or unsubstituted $C_1$ to $C_{20}$ aliphatic group, a substituted or unsubstituted $C_2$ to $C_{30}$ aromatic group, and a substituted or unsubstituted $C_2$ to $C_{30}$ heterocycloalkyl group), and a combination thereof.

Each of $R^1$ and $R^2$ are the same or different and are independently one of hydrogen, a substituted or unsubstituted $C_1$ to $C_{20}$ alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, an organic group including at least one of —O—, —S—, —$SO_2$—, —CO—, —OCO—, —COO—, —CH=CH—, —C≡C—, and $SiR^{102}R^{103}$ and (wherein $R^{102}$ and $R^{103}$ are the same or different and are each independently one of hydrogen, a substituted or unsubstituted $C_1$ to $C_{20}$ alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, and a combination thereof), and a combination thereof.

The moiety B is an electron donating moiety and may provide electrons to an electron acceptor.

Particularly, the moiety B may include moieties represented by one of the Chemical Formulae 2-1 to 2-6, and a combination thereof, but is not limited thereto.

[Chemical Formula 2-1]

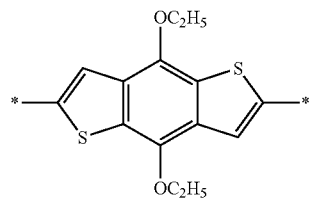

[Chemical Formula 2-2]

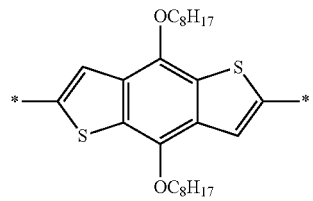

[Chemical Formula 2-3]

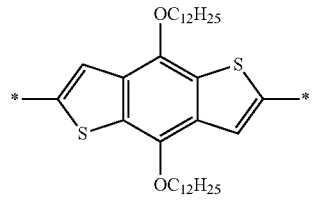

[Chemical Formula 2-4]

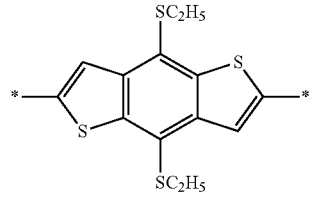

[Chemical Formula 2-5]

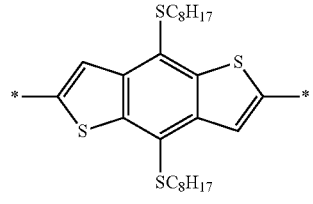

[Chemical Formula 2-6]

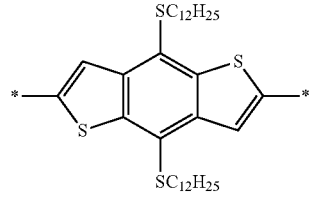

The electron donating polymer may include the moiety A and the moiety B in a mole ratio of about 1:0.5 to about 1:2.5. When the moiety A and the moiety B have the mole ratio within the range, the number average molecular weight of the electron donating polymer may increase, thereby effectively controlling the number average molecular weight of the electron donating polymer and more easily provide the electron donating polymer according to a solution process. Particularly, the electron donating polymer may include the moiety A and the moiety B in a mole ratio of about 1:0.75 to about 1:2.5, for example, in a mole ratio of about 1:1 to about 1:2.

The moiety A and the moiety B may form a repeating unit. Herein, in each repeating unit, the substituents, each $X^1$ to $X^4$, $R^1$ and $R^2$, may be the same or different. The moiety A may be directly bonded to the moiety B or the moiety A may be indirectly bonded to the moiety B with a linking group therebetween.

When the repeating unit including the moiety A and the moiety B is referred to as a repeating unit AB, the repeating unit AB may include one of a repeating unit represented by the Chemical Formula 3, a repeating unit represented by the Chemical Formula 4, and a combination thereof, but is not limited thereto:

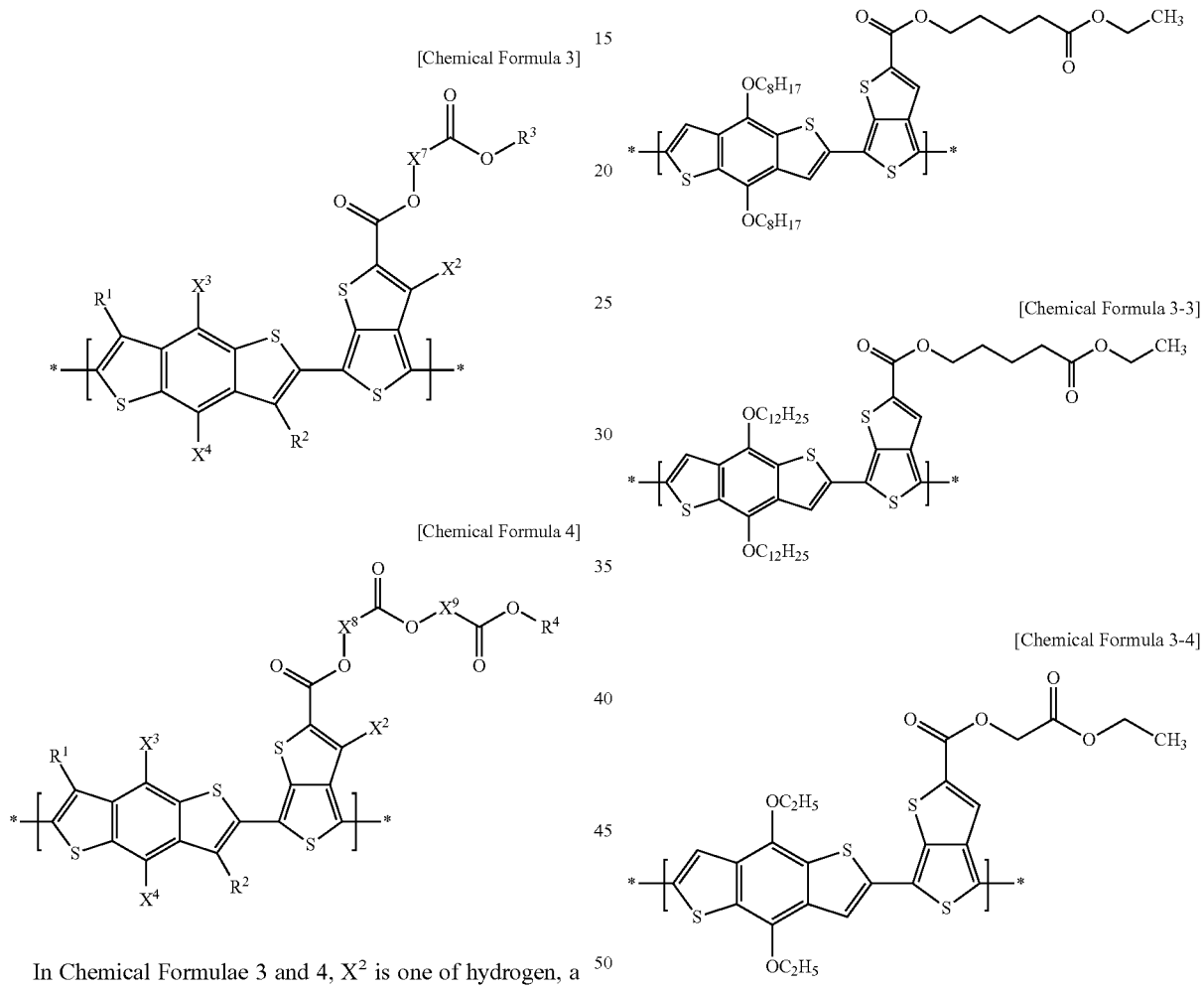

[Chemical Formula 3]

[Chemical Formula 4]

[Chemical Formula 3-1]

[Chemical Formula 3-2]

[Chemical Formula 3-3]

[Chemical Formula 3-4]

[Chemical Formula 3-5]

In Chemical Formulae 3 and 4, $X^2$ is one of hydrogen, a halogen atom, and a substituted or unsubstituted $C_1$ to $C_{20}$ alkyl group, each of $X^3$ and $X^4$ are the same or different and are independently one of a substituted or unsubstituted $C_1$ to $C_{20}$ alkyl group, a substituted or unsubstituted $C_1$ to $C_{20}$ alkoxy group, and $-SR^{101}$ (wherein $R^{101}$ is a substituted or unsubstituted $C_1$ to $C_{20}$ alkyl group), each of $X^7$ to $X^9$ are the same or different and are independently a substituted or unsubstituted divalent $C_1$ to $C_{10}$ aliphatic group, each of $R^1$ and $R^2$ are the same or different and are independently one of hydrogen and a substituted or unsubstituted $C_1$ to $C_{10}$ alkyl group, and each of $R^3$ and $R^4$ are the same or different and are independently one of hydrogen and a substituted or unsubstituted $C_1$ to $C_{10}$ aliphatic group.

Particularly, the repeating unit AB may include, for example, one of the Chemical Formulae 3-1 to 3-7, and a combination thereof, but is not limited thereto.

[Chemical Formula 3-6]

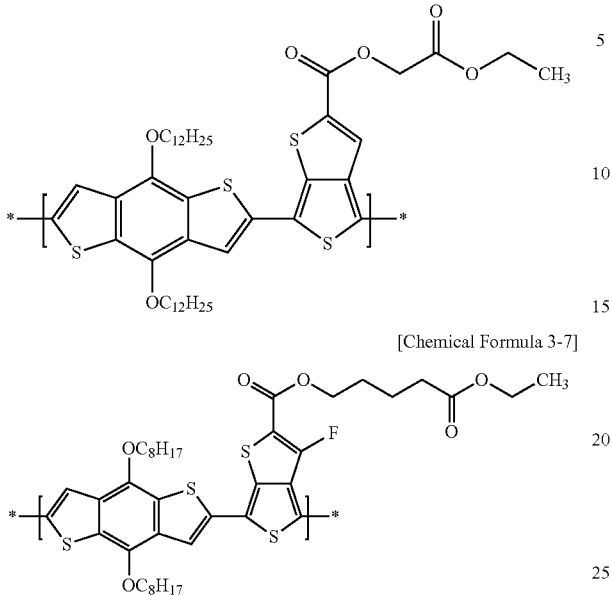

[Chemical Formula 3-7]

The electron donating polymer may further include a moiety C represented by the Chemical Formula 5.

[Chemical Formula 5]

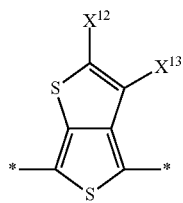

In the Chemical Formula 5, each of $X^{12}$ and $X^{13}$ are the same or different and are independently one of hydrogen, a halogen atom, a hydroxyl group, a substituted or unsubstituted $C_1$ to $C_{20}$ alkyl group, a substituted or unsubstituted $C_3$ to $C_{20}$ cycloalkyl group, a substituted or unsubstituted $C_6$ to $C_{30}$ aryl group, a substituted or unsubstituted $C_2$ to $C_{30}$ heteroaryl group, a substituted or unsubstituted $C_1$ to $C_{20}$ alkoxy group, a substituted or unsubstituted $C_1$ to $C_{30}$ ketone group, a substituted or unsubstituted $C_1$ to $C_{20}$ ester group, and a combination thereof.

Herein, at least one of $X^{12}$ and $X^{13}$ may include a halogen atom.

Particularly, the moiety C may include moieties represented by one of the Chemical Formulae 5-1 to 5-7, and a combination thereof, but is not limited thereto.

[Chemical Formula 5-1]

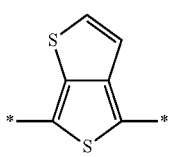

[Chemical Formula 5-2]

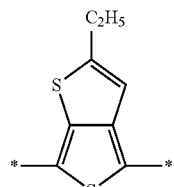

[Chemical Formula 5-3]

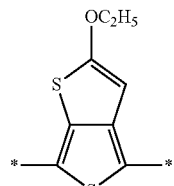

[Chemical Formula 5-4]

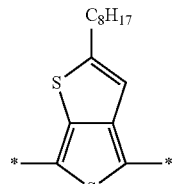

[Chemical Formula 5-5]

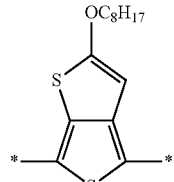

[Chemical Formula 5-6]

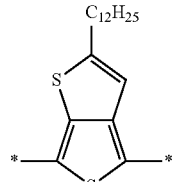

[Chemical Formula 5-7]

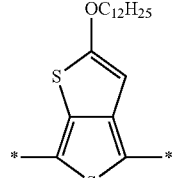

The moiety C may form a repeating unit with a moiety D represented by the Chemical Formula 6:

[Chemical Formula 6]

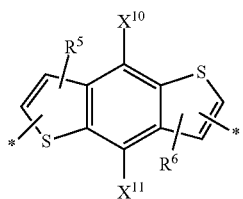

In the Chemical Formula 6, each of $X^{10}$ and $X^{11}$ are the same or different and are independently one of hydrogen, a halogen atom, a substituted or unsubstituted $C_1$ to $C_{20}$ aliphatic group, a hydroxy group, a substituted or unsubstituted $C_1$ to $C_{20}$ alkoxy group, a substituted or unsubstituted $C_1$ to $C_{20}$ ketone group, a substituted or unsubstituted $C_1$ to $C_{20}$ ester group, a thiol group, —$SR^{104}$ (wherein $R^{104}$ is one of a substituted or unsubstituted $C_1$ to $C_{20}$ aliphatic group, a substituted or unsubstituted $C_2$ to $C_{30}$ aromatic group, and a substituted or unsubstituted $C_2$ to $C_{30}$ heterocycloalkyl group), and a combination thereof.

Each of $R^5$ and $R^6$ are the same or different and are independently one of hydrogen, a substituted or unsubstituted $C_1$ to $C_{20}$ alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, an organic group including at least one of —O—, —S—, —SO$_2$—, —CO—, —OCO—, —COO—, —CH=CH—, —C≡C—, and —$SiR^{105}R^{106}$ (wherein $R^{105}$ and $R^{106}$ are the same or different and are each independently one of hydrogen, a substituted or unsubstituted $C_1$ to $C_{20}$ alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, and a combination thereof), and a combination thereof.

Herein, in each repeating unit, the substituents, $X^{10}$ to $X^{13}$, $R^5$ and $R^6$, are the same or different. The moiety C may be directly bonded to the moiety D or the moiety C may be indirectly bonded to the moiety D with a linking group therebetween.

When the repeating unit including the moiety C and the moiety D is referred to as a repeating unit CD, the repeating unit CD may be represented by the Chemical Formula 7:

[Chemical Formula 7]

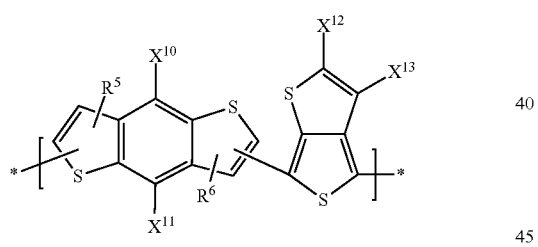

each of $X^{10}$ and $X^{11}$ are the same or different and are independently one of hydrogen, and a substituted or unsubstituted $C_1$ to $C_{20}$ alkoxy group, each of $X^{12}$ and $X^{13}$ are the same or different and are independently one of hydrogen, a halogen atom, a substituted or unsubstituted $C_1$ to $C_{20}$ ketone group, and a substituted or unsubstituted $C_6$ to $C_{20}$ aryl group, and each of $R^5$ and $R^6$ are the same or different and are independently one of hydrogen, and a substituted or unsubstituted $C_1$ to $C_{20}$ alkyl group.

When the electron donating polymer further includes the repeating unit CD represented by Chemical Formula 7, the electron donating polymer may more easily control the energy level and bandgap and improve the absorption efficiency of solar light. In addition, an electron donating polymer having a higher molecular weight by improving the solubility to the organic solvent may be more easily provided, thereby enhancing the hole mobility.

The repeating unit CD may include, for example, repeating units represented by one of the following Chemical Formulae 7-1 to 7-5, and a combination thereof, but is not limited thereto.

[Chemical Formula 7-1]

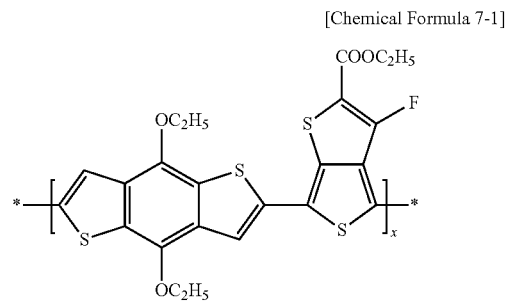

[Chemical Formula 7-2]

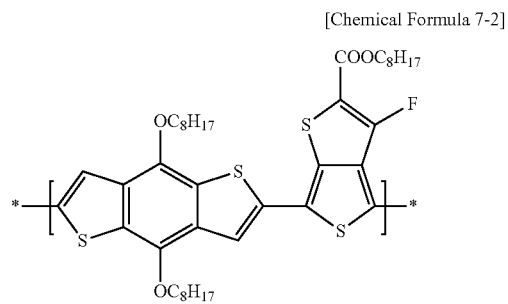

[Chemical Formula 7-3]

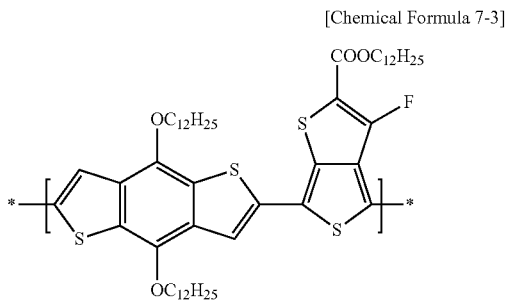

[Chemical Formula 7-4]

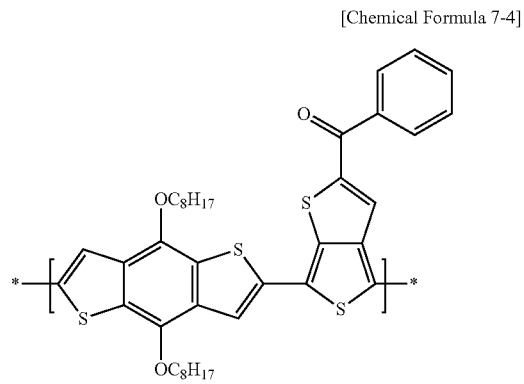

[Chemical Formula 7-5]

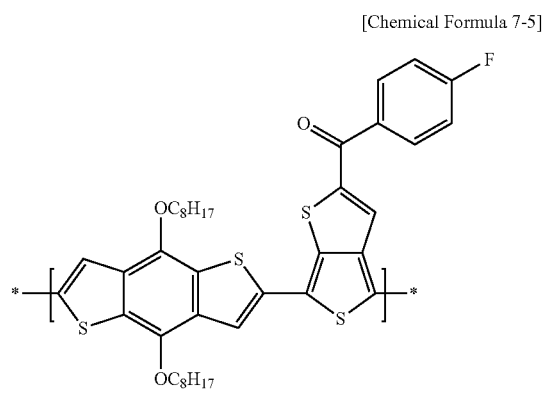

The electron donating polymer may be formed by copolymerizing the repeating unit AB and the repeating unit CD.

The electron donating polymer may include, for example, a copolymer having at least one of a repeating unit represented by the Chemical Formula 8, a repeating unit represented by the Chemical Formula 9, and a combination thereof, but is not limited thereto.

[Chemical Formula 8]

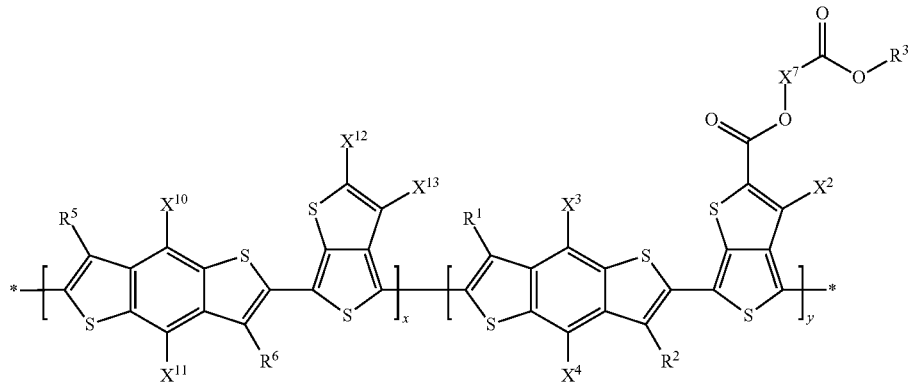

[Chemical Formula 9]

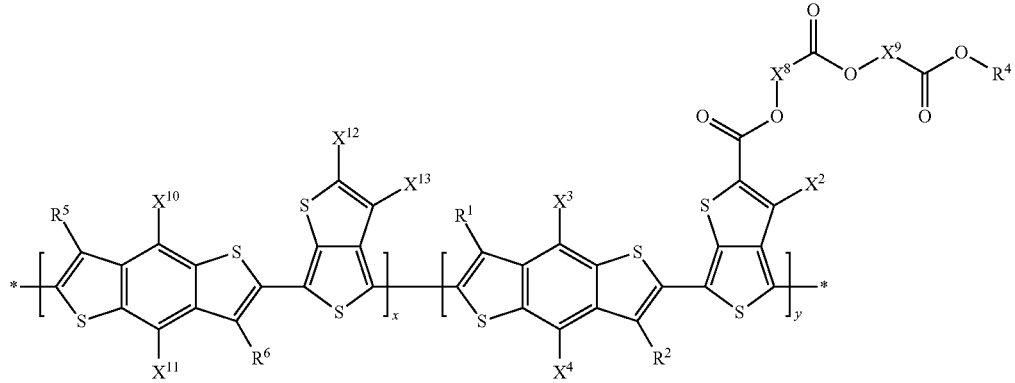

In the Chemical Formulae 8 or 9, $X^2$, $X^3$, $X^4$, $X^7$ to $X^{13}$, and $R^1$ to $R^6$ are the same as described above and x and y are each a mole ratio and satisfy the following equations: $0 \leq x \leq 10$ and $0 < y \leq 10$.

For example, at least one of $X^2$, $X^{12}$ and $X^{13}$ may include a halogen atom.

When the mole ratio of x and y is within the range, the energy level and bandgap may be more easily controlled, and the absorption efficiency of solar light may be improved. In addition, an electron donating polymer having a higher molecular weight by improving the solubility to the organic solvent may be more easily provided, thereby effectively enhancing the hole mobility.

The electron donating polymer may include, for example, copolymers having repeating units represented by one of the Chemical Formulae 8-1 to 8-10, and a combination thereof, but is not limited thereto.

[Chemical Formula 8-1]

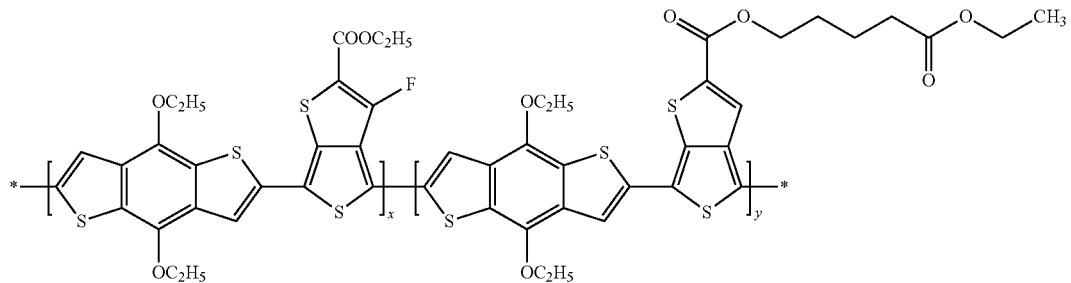

[Chemical Formula 8-2]
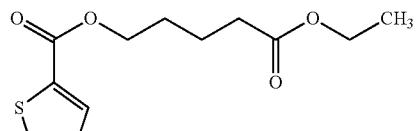
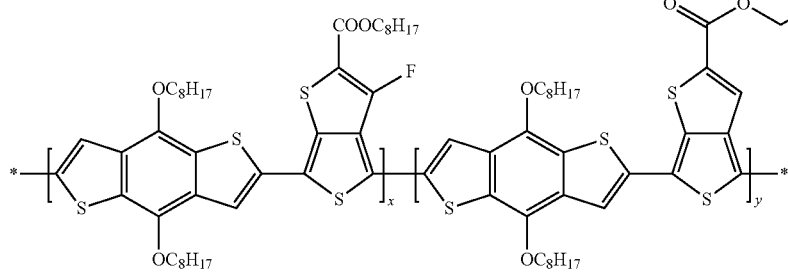
[Chemical Formula 8-3]
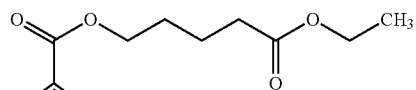
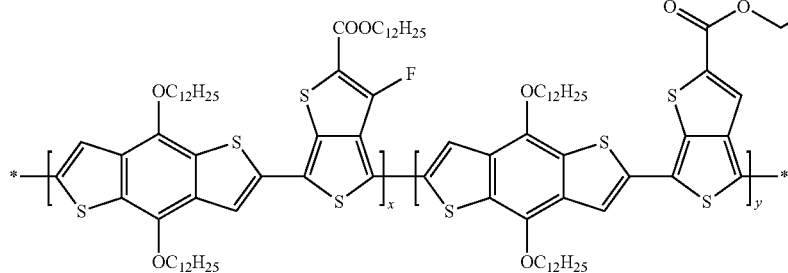
[Chemical Formula 8-4]
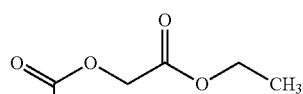
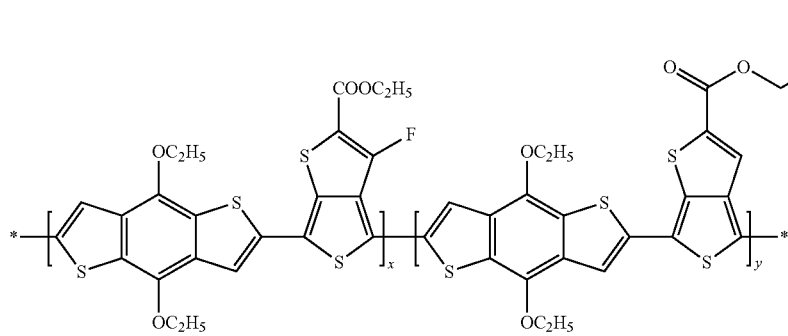
[Chemical Formula 8-5]
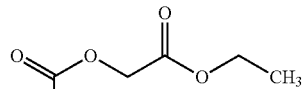
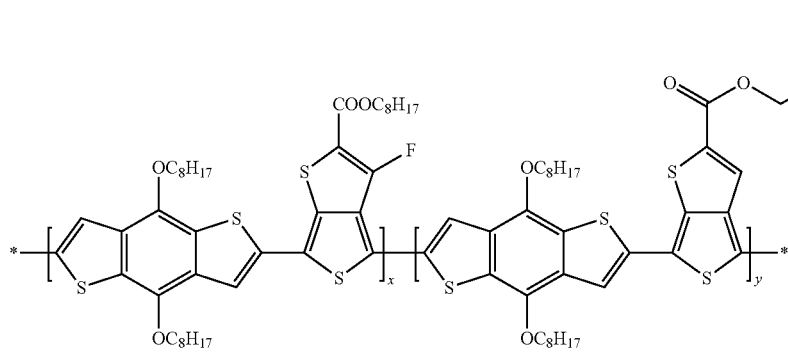
[Chemical Formula 8-6]
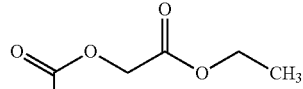
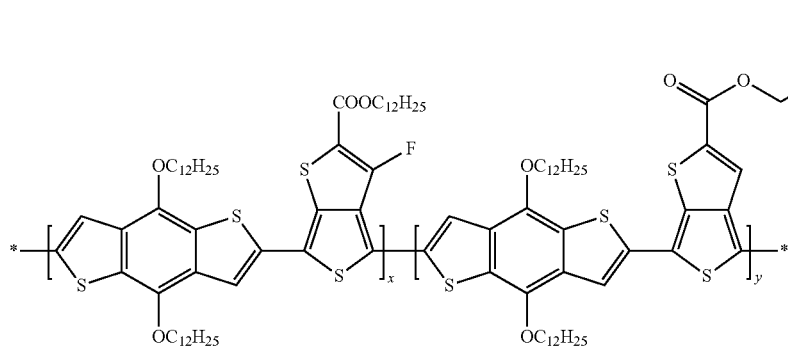

[Chemical Formula 8-7]

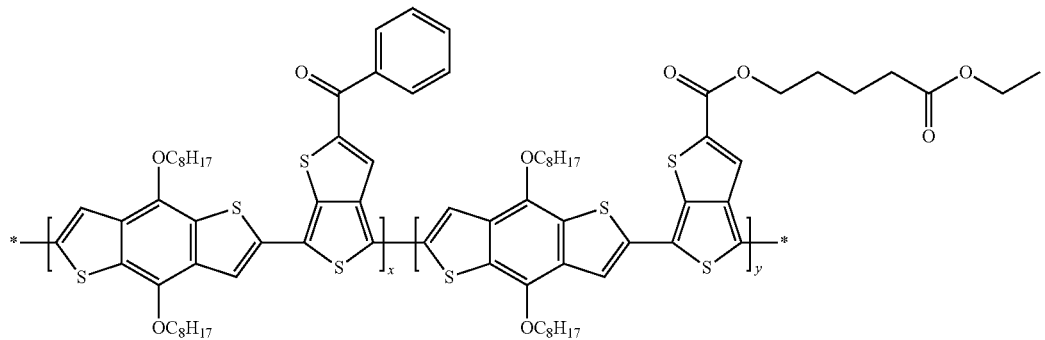

[Chemical Formula 8-8]

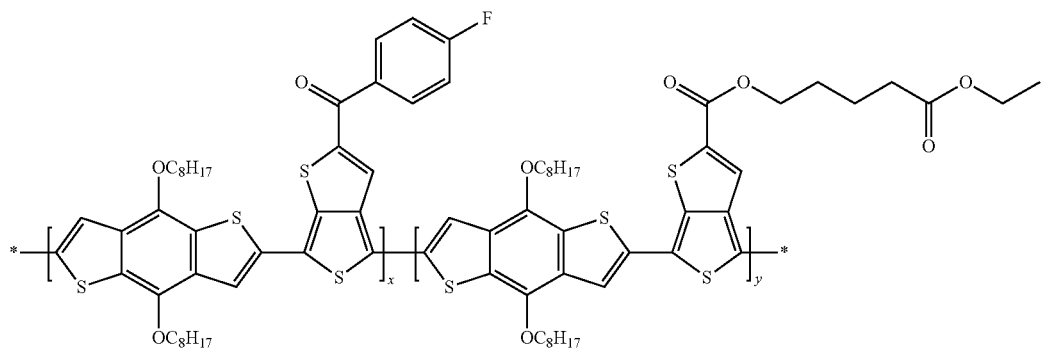

[Chemical Formula 8-9]

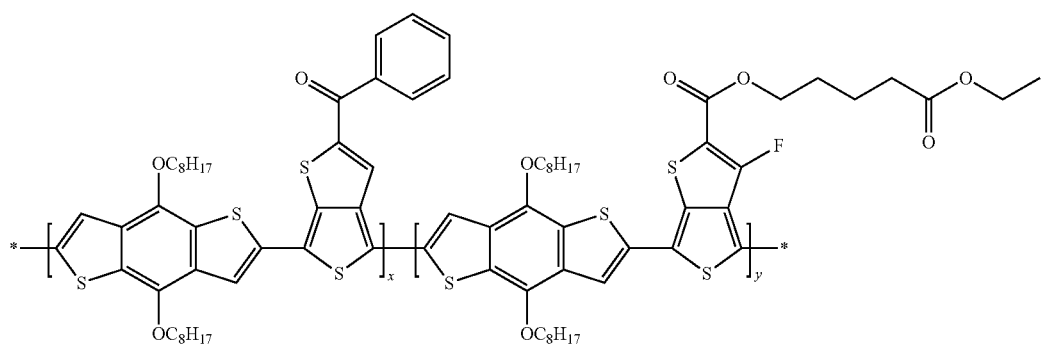

[Chemical Formula 8-10]

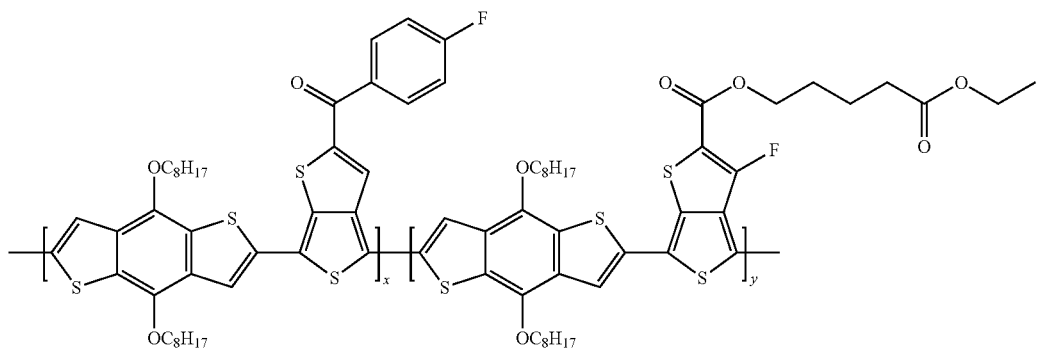

In the Chemical Formulae 8-1 to 8-10, x and y may satisfy the following equations: $0 \leq x \leq 10$ and $0 < y \leq 10$.

The electron donating polymer may have a number average molecular weight of about 1,000 to about 800,000. When the electron donating polymer has the number average molecular weight within the range, the solution composition may be more easily controlled when preparing the electron donating polymer, thereby effectively controlling the properties of the electron donating polymer. In addition, the electron donating polymer may be more easily processed to facilitate the same to provide the organic solar cell. For example, the electron donating polymer may have a number average molecular weight of about 2,000 to about 100,000, for example, a number average molecular weight of about 5,000 to about 50,000.

The electron donating polymer may have a bandgap of about 1.2 eV to about 2.5 eV. When the electron donating polymer has the bandgap within the range, the solar light in a wider wavelength region may be more effectively absorbed, thereby enhancing the short circuit current density (Jsc) to effectively improve the efficiency of an organic solar cell using the same. Particularly, the electron donating polymer may have a bandgap of about 1.5 eV to about 2.1 eV, for example, a bandgap of about 1.6 eV to about 2.0 eV.

FIG. 1 is a cross-sectional view of a solar cell according to example embodiments. Referring to FIG. 1, a solar cell 100 according to example embodiments may include a substrate 10, a lower electrode 20 on one surface of the substrate 10, a photoactive layer 30 on one surface of the lower electrode 20, and an upper electrode 40 on one surface of the photoactive layer 30.

The substrate 10 may be made of a transparent material, for example, an inorganic material, e.g., glass or an organic material, e.g., polycarbonate, polymethylmethacrylate, polyethylene terephthalate, polyethylene naphthalate, polyamide, and polyethersulfone.

Either of the lower electrode 20 and the upper electrode 40 is an anode, while the other is a cathode. Either of the lower electrode 20 and the upper electrode 40 may be made of a transparent conductor, e.g., indium tin oxide (ITO), indium-doped zinc oxide (IZO), tin oxide ($SnO_2$), aluminum-doped zinc oxide (AZO), and gallium-doped zinc oxide (GZO), while the other is made of an opaque conductor, e.g., aluminum (Al), silver (Ag), gold (Au), and lithium (Li).

The photoactive layer 30 may include an electron acceptor made of an n-type semiconductor material and an electron donor made of a p-type semiconductor material.

The electron acceptor may include, for example, a fullerene with a larger electron affinity (C60, C70, C74, C76, C78, C82, C84, C720, and C860); fullerene derivatives, e.g., 1-(3-methoxy-carbonyl)propyl-1-phenyl(6,6)C61 (PCBM), C71-PCBM, C84-PCBM, and bis-PCBM; perylene; an inorganic semiconductor, e.g., CdS, CdTe, CdSe, and ZnO; or a combination thereof.

The electron donor may include the aforementioned electron donating polymer. By including the electron donating polymer, the organic solar cell may have a higher short circuit current density (Jsc) compared to the conventional organic solar cell while maintaining a similar open circuit voltage (Voc) to the conventional organic solar cell. In addition, the electron donor may be dissolved in various solvents and be effectively miscible with the electron acceptor. Thereby, the organic solar cell may have improved photoelectric conversion efficiency.

The electron acceptor and the electron donor may have, for example, a bulk heterojunction structure. The bulk heterojunction structure generates a photocurrent by diffusing a pair of electron-holes excited by light absorbed in the photoactive layer 30 into an interface between the electron acceptor and the electron donor, separating the pair of electron-holes into electrons and holes due to an electronic affinity difference of two materials on the interface, and moving the electrons through the electron acceptor to the cathode and the holes through the electron donor to the anode.

An interlayer (not shown) may be formed between the lower electrode 20 and the photoactive layer 30 and/or between the upper electrode 40 and the photoactive layer 30. The interlayer may improve carrier mobilities between the lower electrode 20 and the photoactive layer 30 and/or between the upper electrode 40 and the photoactive layer 30.

Hereinafter, this disclosure is illustrated in more detail with reference to examples. However, these are example embodiments and are not limiting.

SYNTHESES

Synthesis 1

5-ethoxy-5-oxopentyl-4,6-dibromothieno[3,4-b]thiophene-2-carboxylate is synthesized according to the Reaction Scheme 3.

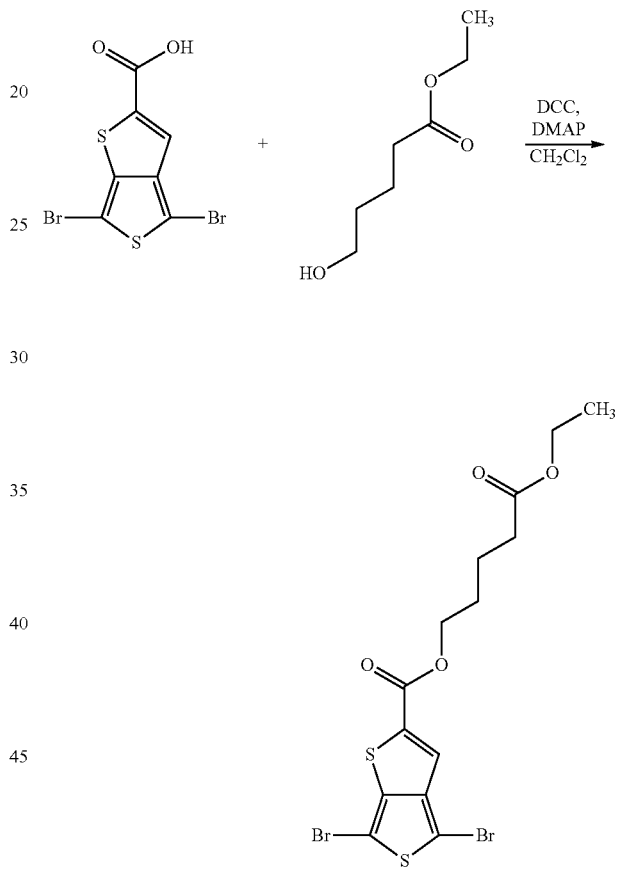

About 1.00 g (2.92 mmol) of 4,6-dibromothieno[3,4-b]thiophene-2-carboxylic acid, about 0.731 g (3.51 mmol) of dicyclohexylcarbodiimide (DCC), and about 0.123 g (1.01 mmol) of 4-dimethylaminopyridine (DMAP) are dissolved in about 10 ml of dichloromethane (MC) under a nitrogen ($N_2$) atmosphere, and added with about 2.19 g (15.0 mmol) of ethyl-5-hydroxypentanoate and agitated at room temperature for 20 hours. About 50 ml of water is added thereto and extracted with dichloromethane. After the extraction, a relatively small amount of water present in the organic layer is removed by sodium sulfate, a solvent is removed, and purified according to column chromatography using a silica gel to provide 5-ethoxy-5-oxopentyl-4,6-dibromothieno[3,4-b]thiophene-2-carboxylate.

An electron donating polymer is prepared according to the following Reaction Scheme 4.

[Reaction Scheme 4]

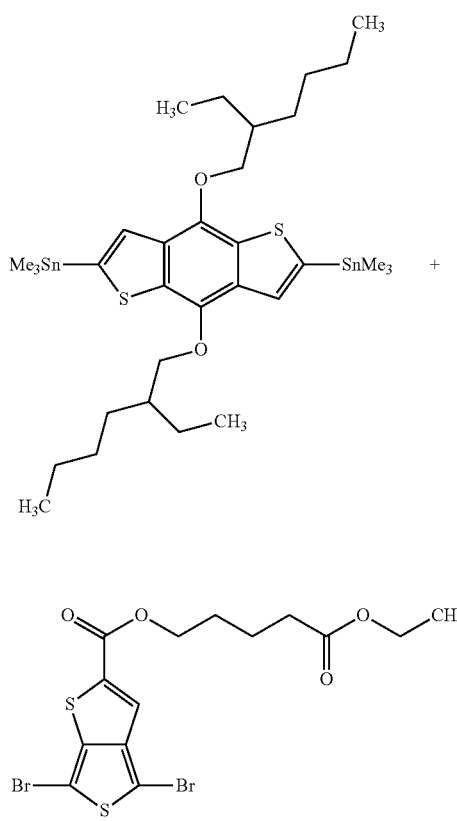

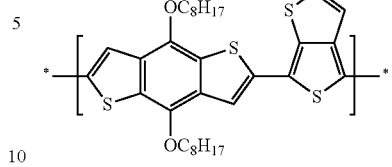

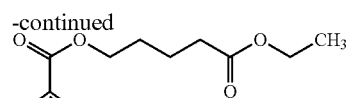

About 386 mg (0.500 mmol) of 2,6-bis(trimethyltin)-4,8-bis(2-ethylhexyloxy)benzo[1,2-b:4,5-b']dithiophene and about 235 mg (0.500 mmol) of 5-ethoxy-5-oxopentyl-4,6-dibromothieno[3,4-b]thiophene-2-carboxylate are introduced into about 10 ml of DMF/toluene (dimethylformamide/toluene, volume ratio=1/4), added with about 23 mg of a Pd(PPh$_3$)$_4$ catalyst, agitated, and heated to a temperature of about 120° C. Then, the mixture is cooled into a room temperature, precipitated in 1M HCl (in methanol), filtered, and reprecipitated in methanol to obtain an electron donating polymer having the repeating unit.

The obtained electron donating polymer has a number average molecular weight of about 30,000. The number average molecular weight is measured by gel permeation chromathgraphy (GPC) (Polymer Laboratories PL gel Mixed C GPC column, Waters 2690, Waters 2410 RI detector, Eluent: THF, Flow rate: 1.0 ml/min)

Synthesis 2

5-ethoxy-5-oxopentyl-4,6-dibromothieno[3,4-b]thiophene-2-carboxylate is prepared according to the same procedure as in Synthesis 1.

Subsequently, an electron donating polymer is obtained according to the following Reaction Scheme 5.

[Reaction Scheme 5]

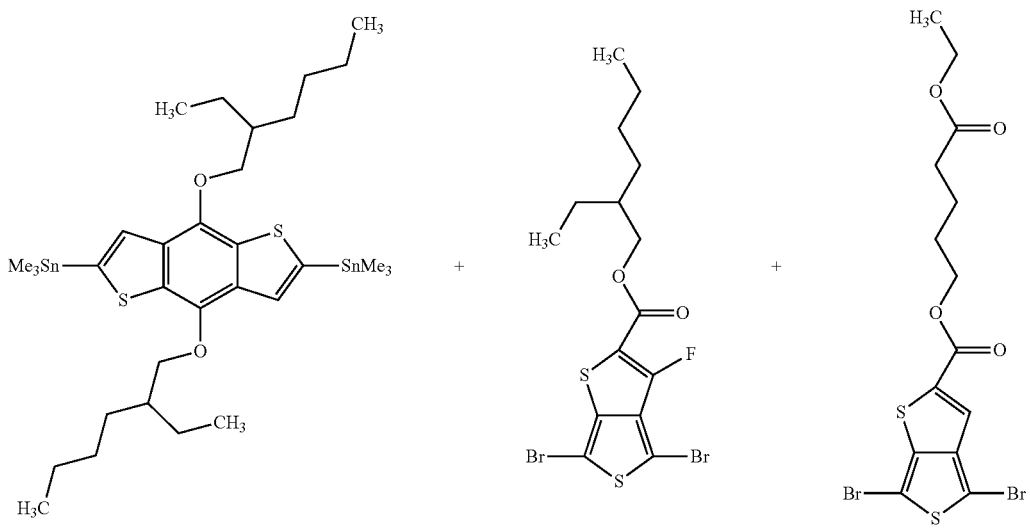

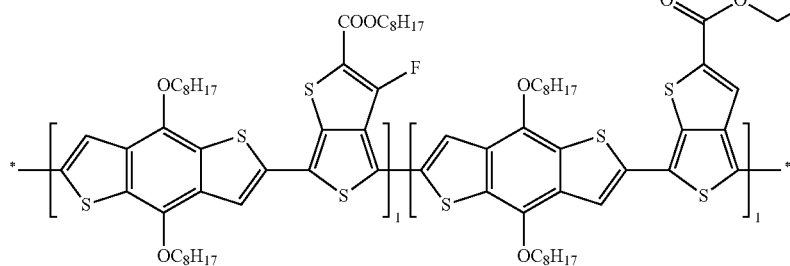

About 386 mg (0.500 mmol) of 2,6-bis(trimethyltin)-4,8-bis(2-ethylhexyloxy)benzo[1,2-b:4,5-b']dithiophene, about 118 mg (0.250 mmol) of 2-ethylhexyl-4,6-dibromo-3-fluorothieno[3,4-b]thiophene-2-carboxylate, and about 118 mg (0.250 mmol) of 5-ethoxy-5-oxopentyl-4,6-dibromothieno[3,4-b]thiophene-2-carboxylate are introduced into about 10 ml of DMF/toluene (dimethylformamide/toluene, volume ratio=1/4), added with about 23 mg of a Pd(PPh$_3$)$_4$ catalyst and agitated, thereby heated to a temperature of about 120° C. Then, the mixture is cooled into a room temperature, precipitated in 1M HCl (in methanol), filtered, and reprecipitated in methanol to obtain an electron donating polymer having the repeating unit.

The obtained electron donating polymer has a number average molecular weight of about 60,000.

Synthesis 3

About 386 mg (0.500 mmol) of 2,6-bis(trimethyltin)-4,8-bis(2-ethylhexyloxy)benzo[1,2-b:4,5-b']dithiophen, about 101 mg (0.250 mmol) of 4,6-dibromothieno[3,4-b]thiophene-2-yl)(phenyl)methanone, and 118 mg (0.250 mmol) of 5-ethoxy-5-oxopentyl-4,6-dibromothieno[3,4-b]thiophene-2-carboxylate are introduced into about 10 ml of DMF/toluene (dimethylformamide/toluene, volume ratio=1/4), added with about 23 mg of a Pd(PPh$_3$)$_4$ catalyst and agitated, thereby heated to a temperature of about 120° C. Then, the mixture is cooled into a room temperature, precipitated in 1M HCl (in methanol), filtered, and reprecipitated in methanol to obtain an electron donating polymer having the repeating unit represented by the Chemical Formula 8-7.

The obtained electron donating polymer has a number average molecular weight of about 34,000.

Synthesis 4

About 386 mg (0.500 mmol) of 2,6-bis(trimethyltin)-4,8-bis(2-ethylhexyloxy)benzo[1,2-b:4,5-b']dithiophen and 244 mg (0.500 mmol) of 5-ethoxy-5-oxopentyl-4,6-dibromo-3-fluorothieno[3,4-b]thiophene-2-carboxylate are introduced into about 10 ml of DMF/toluene (dimethylformamide/toluene, volume ratio=1/4), added with about 23 mg of a Pd(PPh$_3$)$_4$ catalyst and agitated, thereby heated to a temperature of about 120° C. Then, the mixture is cooled into a room temperature, precipitated in 1M HCl (in methanol), filtered, and reprecipitated in methanol to obtain an electron donating polymer having the repeating unit represented by the Chemical Formula 3-7.

[Chemical Formula 3-7]

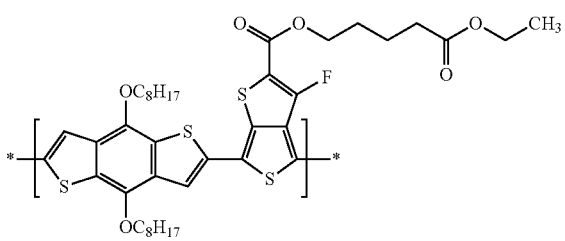

[Chemical Formula 8-7]

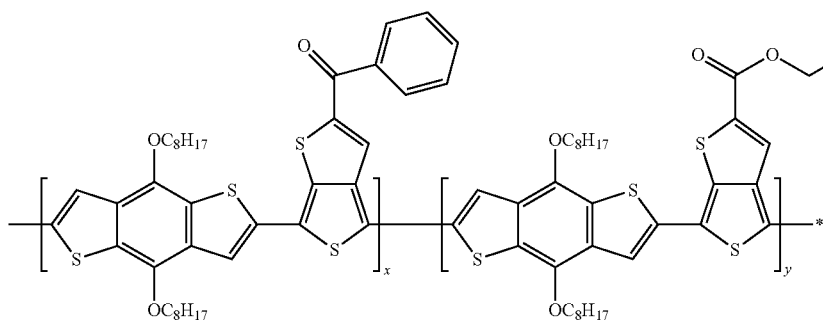

The obtained electron donating polymer has a number average molecular weight of about 54,000.

Synthesis 5

About 386 mg (0.500 mmol) of 2,6-bis(trimethyltin)-4,8-bis(2-ethylhexyloxy)benzo[1,2-b:4,5-b']dithiophen, about 105 mg (0.250 mol) of 4,6-dibromothieno[3,4-b]thiophene-2-yl)(4-fluorophenyl)methanone and 118 mg (0.250 mmol) of 5-ethoxy-5-oxopentyl-4,6-dibromothieno[3,4-b]thiophene-2-carboxylate are introduced into about 10 ml of DMF/toluene (dimethylformamide/toluene, volume ratio=1/4), added with about 23 mg of a Pd(PPh$_3$)$_4$ catalyst and agitated, thereby heated to a temperature of about 120° C. Then, the mixture is cooled into a room temperature, precipitated in 1M HCl (in methanol), filtered, and reprecipitated in methanol to obtain an electron donating polymer having the repeating unit represented by the Chemical Formula 8-8.

[Chemical Formula 8-8]

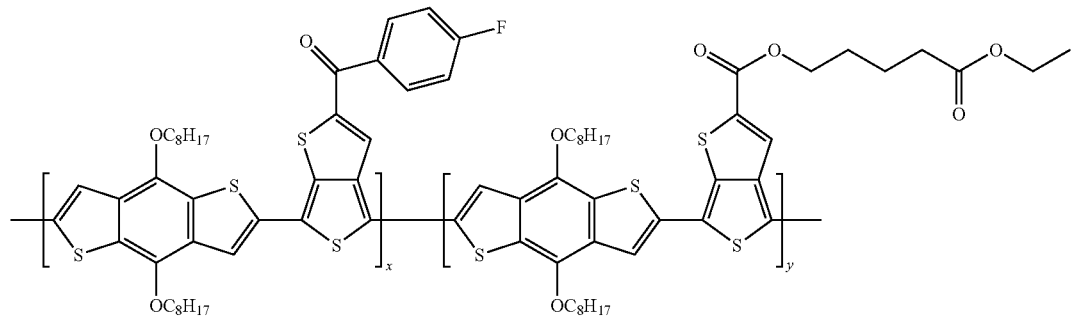

The obtained electron donating polymer has a number average molecular weight of about 45,000.

Synthesis 6

About 386 mg (0.500 mmol) of 2,6-bis(trimethyltin)-4,8-bis(2-ethylhexyloxy)benzo[1,2-b:4,5-b']dithiophen, about 101 mg (0.250 mol) of 4,6-dibromothieno[3,4-b]thiophene-2-yl)(phenyl)methanone and 122 mg (0.250 mmol) of 5-ethoxy-5-oxopentyl-4,6-dibromo-3-fluorothieno[3,4-b]thiophene-2-carboxylate are introduced into about 10 ml of DMF/toluene (dimethylformamide/toluene, volume ratio=1/4), added with about 23 mg of a Pd(PPh$_3$)$_4$ catalyst and agitated, thereby heated to a temperature of about 120° C. Then, the mixture is cooled into a room temperature, precipitated in 1M HCl (in methanol), filtered, and reprecipitated in methanol to obtain an electron donating polymer having the repeating unit represented by the Chemical Formula 8-9.

[Chemical Formula 8-9]

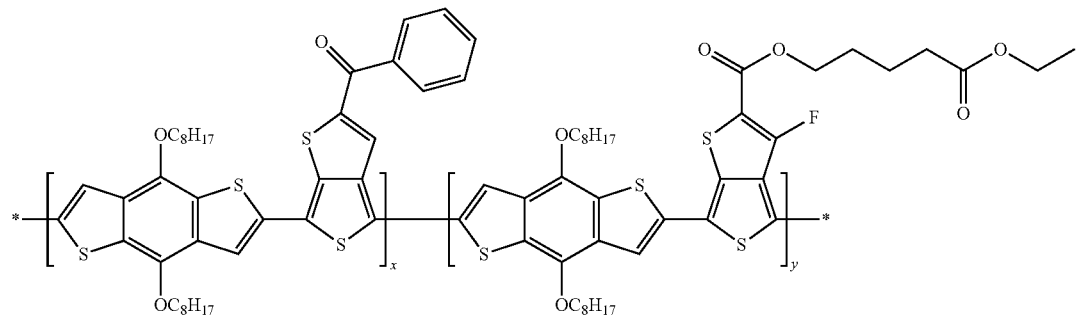

The obtained electron donating polymer has a number average molecular weight of about 22,000.

Synthesis 7

About 386 mg (0.500 mmol) of 2,6-bis(trimethyltin)-4,8-bis(2-ethylhexyloxy)benzo[1,2-b:4,5-b']dithiophen, about 105 mg (0.250 mol) of 4,6-dibromothieno[3,4-b]thiophene-2-yl)(4-fluorophenyl)methanone and 122 mg (0.250 mmol) of 5-ethoxy-5-oxopentyl-4,6-dibromo-3-fluorothieno[3,4-b]thiophene-2-carboxylate are introduced into about 10 ml of DMF/toluene (dimethylformamide/toluene, volume ratio=1/4), added with about 23 mg of a Pd(PPh$_3$)$_4$ catalyst and agitated, thereby heated to a temperature of about 120° C. Then, the mixture is cooled into a room temperature, precipitated in 1M HCl (in methanol), filtered, and reprecipitated in methanol to obtain an electron donating polymer the repeating unit represented by the Chemical Formula 8-10.

DMF/toluene (dimethylformamide/toluene, volume ratio=1/4), added with about 23 mg of a Pd(PPh$_3$)$_4$ catalyst and agitated, thereby heated to a temperature of about 120° C. Then, the mixture is cooled into a room temperature, precipitated in 1M HCl (in methanol), filtered, and reprecipitated in methanol to obtain an electron donating polymer having the repeating unit represented by the Chemical Formula 8-10 (x≈1, y≈2).

The obtained electron donating polymer has a number average molecular weight of about 30,000.

Synthesis 10

About 232 mg (0.300 mmol) of 2,6-bis(trimethyltin)-4,8-bis(2-ethylhexyloxy)benzo[1,2-b:4,5-b']dithiophen, about 84.0 mg (0.200 mol) of 4,6-dibromothieno[3,4-b]thiophene-2-yl)(4-fluorophenyl)methanone and 48.8 mg (0.100 mmol) of 5-ethoxy-5-oxopentyl-4,6-dibromo-3-fluorothieno[3,4-b]

[Chemical Formula 8-10]

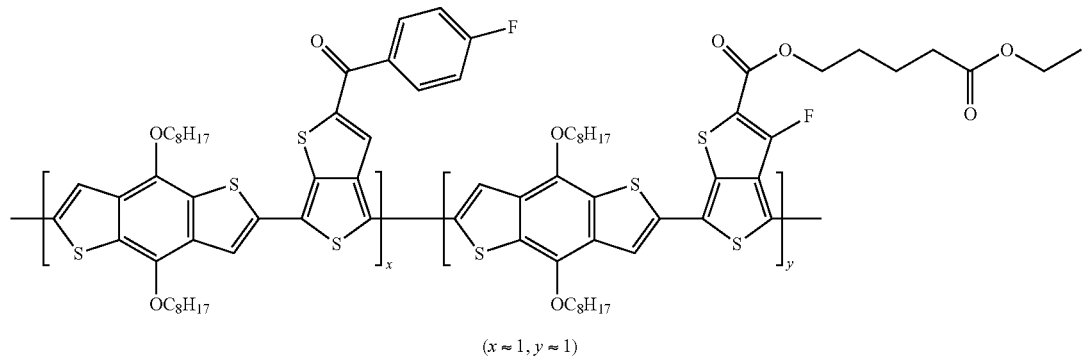

(x ≈ 1, y ≈ 1)

The obtained electron donating polymer has a number average molecular weight of about 32,000.

Synthesis 8

About 309 mg (0.400 mmol) of 2,6-bis(trimethyltin)-4,8-bis(2-ethylhexyloxy)benzo[1,2-b:4,5-b']dithiophen, about 42.0 mg (0.100 mol) of 4,6-dibromothieno[3,4-b]thiophene-2-yl)(4-fluorophenyl)methanone and 147 mg (0.300 mmol) of 5-ethoxy-5-oxopentyl-4,6-dibromo-3-fluorothieno[3,4-b]thiophene-2-carboxylate are introduced into about 10 ml of DMF/toluene (dimethylformamide/toluene, volume ratio=1/4), added with about 23 mg of a Pd(PPh$_3$)$_4$ catalyst and agitated, thereby heated to a temperature of about 120° C. Then, the mixture is cooled into a room temperature, precipitated in 1M HCl (in methanol), filtered, and reprecipitated in methanol to obtain an electron donating polymer having the repeating unit represented by the Chemical Formula 8-10 (x≈1, y≈3).

The obtained electron donating polymer has a number average molecular weight of about 32,000.

Synthesis 9

About 232 mg (0.300 mmol) of 2,6-bis(trimethyltin)-4,8-bis(2-ethylhexyloxy)benzo[1,2-b:4,5-b']dithiophen, about 42.0 mg (0.100 mol) of 4,6-dibromothieno[3,4-b]thiophene-2-yl)(4-fluorophenyl)methanone and 97.6 mg (0.200 mmol) of 5-ethoxy-5-oxopentyl-4,6-dibromo-3-fluorothieno[3,4-b]thiophene-2-carboxylate are introduced into about 10 ml of thiophene-2-carboxylate are introduced into about 10 ml of DMF/toluene (dimethylformamide/toluene, volume ratio=1/4), added with about 23 mg of a Pd(PPh$_3$)$_4$ catalyst and agitated, thereby heated to a temperature of about 120° C. Then, the mixture is cooled into a room temperature, precipitated in 1M HCl (in methanol), filtered, and reprecipitated in methanol to obtain an electron donating polymer having the repeating unit represented by the Chemical Formula 8-10 (x≈2, y≈1).

The obtained electron donating polymer has a number average molecular weight of about 35,000.

Synthesis 11

About 309 mg (0.400 mmol) of 2,6-bis(trimethyltin)-4,8-bis(2-ethylhexyloxy)benzo[1,2-b:4,5-b']dithiophen, about 84.0 mg (0.300 mol) of 4,6-dibromothieno[3,4-b]thiophene-2-yl)(4-fluorophenyl)methanone and 48.8 mg (0.100 mmol) of 5-ethoxy-5-oxopentyl-4,6-dibromo-3-fluorothieno[3,4-b]thiophene-2-carboxylate are introduced into about 10 ml of DMF/toluene (dimethylformamide/toluene, volume ratio=1/4), added with about 23 mg of a Pd(PPh$_3$)$_4$ catalyst and agitated, thereby heated to a temperature of about 120° C. Then, the mixture is cooled into a room temperature, precipitated in 1M HCl (in methanol), filtered, and reprecipitated in methanol to obtain an electron donating polymer having the repeating unit represented by the Chemical Formula 8-10 (x≈3, y≈1).

The obtained electron donating polymer has a number average molecular weight of about 30,000.

Comparative Synthesis 1

Poly(3-hexylthiophene) (P3HT) having a repeating unit represented by the Chemical Formula 10 is prepared by commercial product P100 (manufactured by BASF, Mw=50,000).

[Chemical Formula 10]

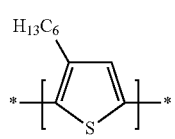

Comparative Synthesis 2

Poly[4,8-bis(2-ethylhexyloxy)benzo(1,2-b:4,5-b') dithiophene-2,6-diyl-alt-(2-dodecyl)thieno(3,4-b) thiophene-2-carboxylate-4,6-diyl] (Mw=47,800) having a repeating unit represented by the Chemical Formula 11 is prepared.

[Chemical Formula 11]

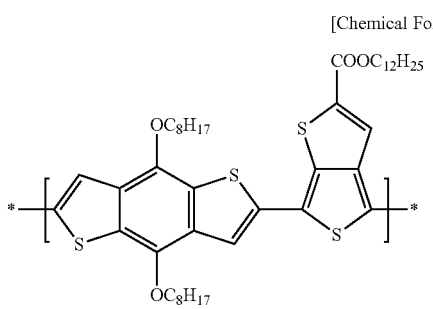

Comparative Synthesis 3

Poly[4,8-bis(2-ethylhexyloxy)benzo(1,2-b:4,5-b') dithiophene-2,6-diyl-alt-(2-ethylhexyl)-3-fluorothieno(3,4-b)thiophene-2-carboxylate-4,6-diyl] (Mw=48,000) having a repeating unit represented by the Chemical Formula 12 is prepared.

[Chemical Formula 12]

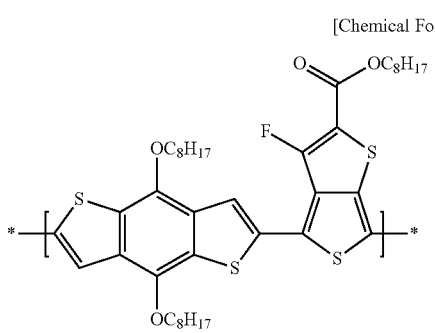

Comparative Synthesis 4

A polymer having a repeating unit represented by the Chemical Formula 13 (Mn=13,700) is prepared.

[Chemical Formula 13]

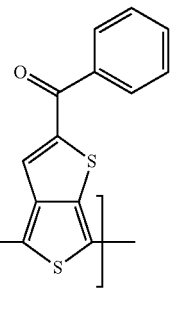

Evaluation of the Electron Donating Polymer

Evaluation 1: Measurement of IR

For each electron donating polymer obtained from Synthesis 1 to 3, an IR spectrum is obtained according to the ATR method using a Bio Rad FTS 6000 FTIR spectrometer.

Figure 2:
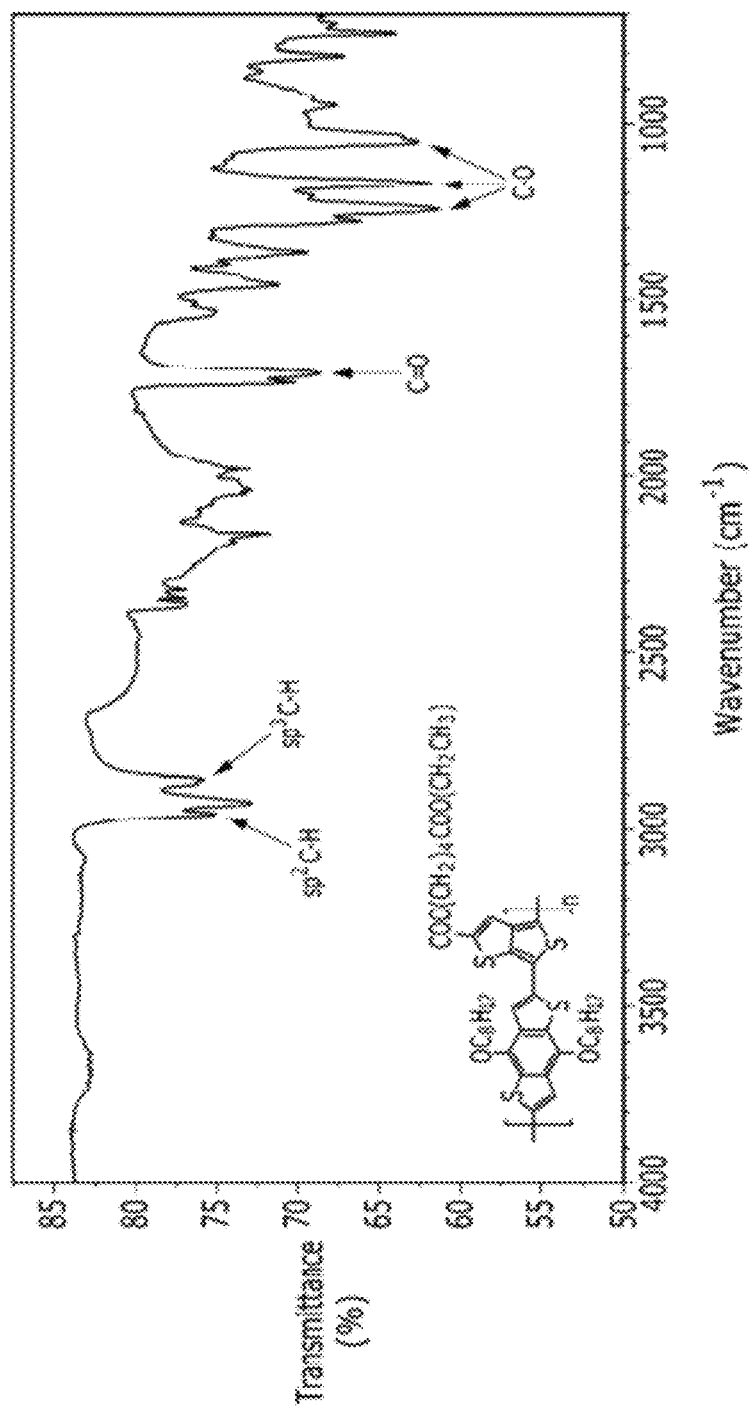
Figure 3:
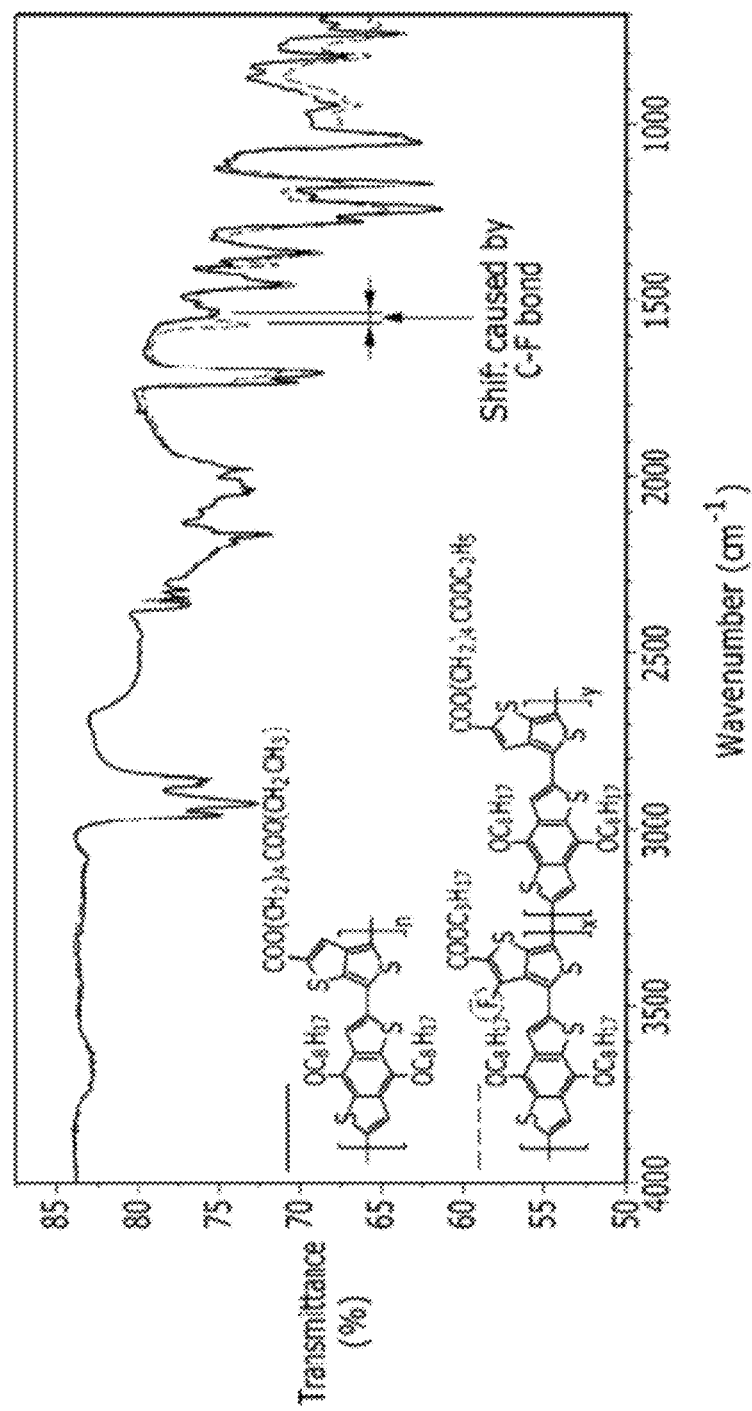
Figure 4:
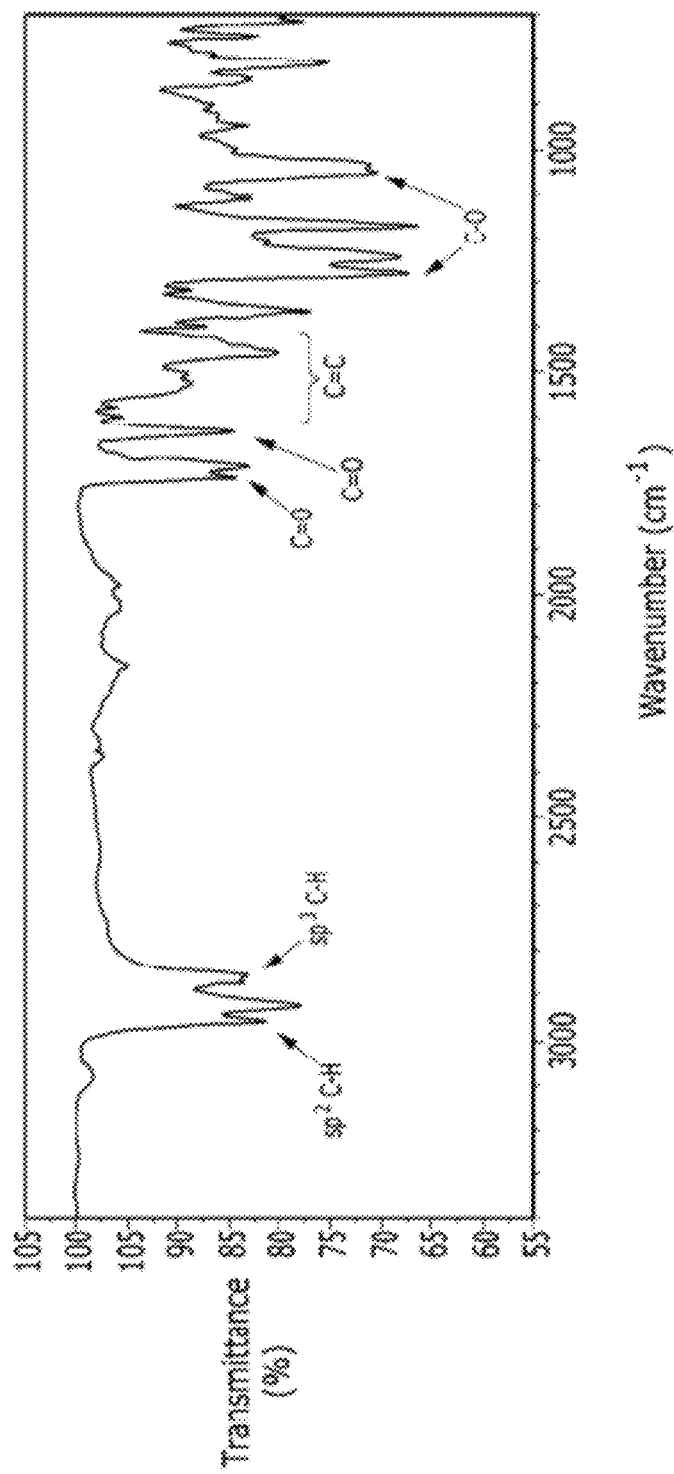

FIGS. 2 to 4 are IR spectrums for the electron donating polymer obtained from Synthesis 1 to 3, respectively.

As shown in FIG. 2, there are a 1700 cm−1 peak showing a C=O bond and 1250, 1180, 1050 cm−1 peaks showing C—O bonds, so the electron donating polymer according to Synthesis 1 is obtained.

As shown in FIG. 3, there are a 1700 cm−1 peak showing a C=O bond, 1250, 1180, 1050 cm−1 peaks showing C—O bonds, and a peak shift near 1500 cm−1 showing fluorination, so the electron donating polymer according to Synthesis 2 is obtained.

As shown in FIG. 4, there are a 1700 $cm^{-1}$ peak showing a C=O bond, and 1250, 1180, 1050 $cm^{-1}$ peaks showing C—O bonds, so the electron donating polymer according to Synthesis 3 is obtained.

Evaluation 2: Light Absorption Characteristic

Each of electron donating polymers according to Syntheses 1 to 11 and Comparative Synthesis 1 to 4 is dissolved in dichlorobenzene and glass plates are dipped therein. They are dried to remove the solvent to provide films. The ultraviolet-visible ray (UV-Vis) absorption spectrum of the obtained films is obtained using Cary 5000 UV spectroscopy equipment manufactured by Varian.

Figure 5A:
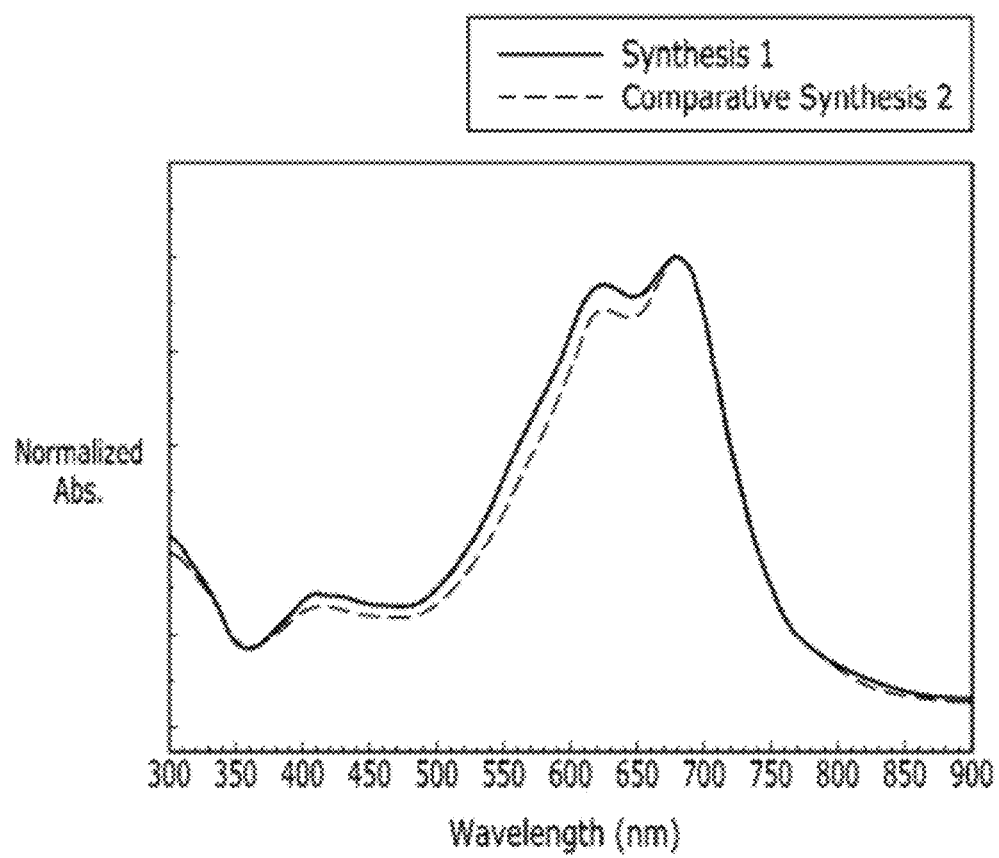
FIG. 5A is the ultraviolet-visible ray (UV-Vis) absorption spectrums of the electron donating polymers according to Synthesis 1 and Comparative Synthesis 2.
Figure 5B:
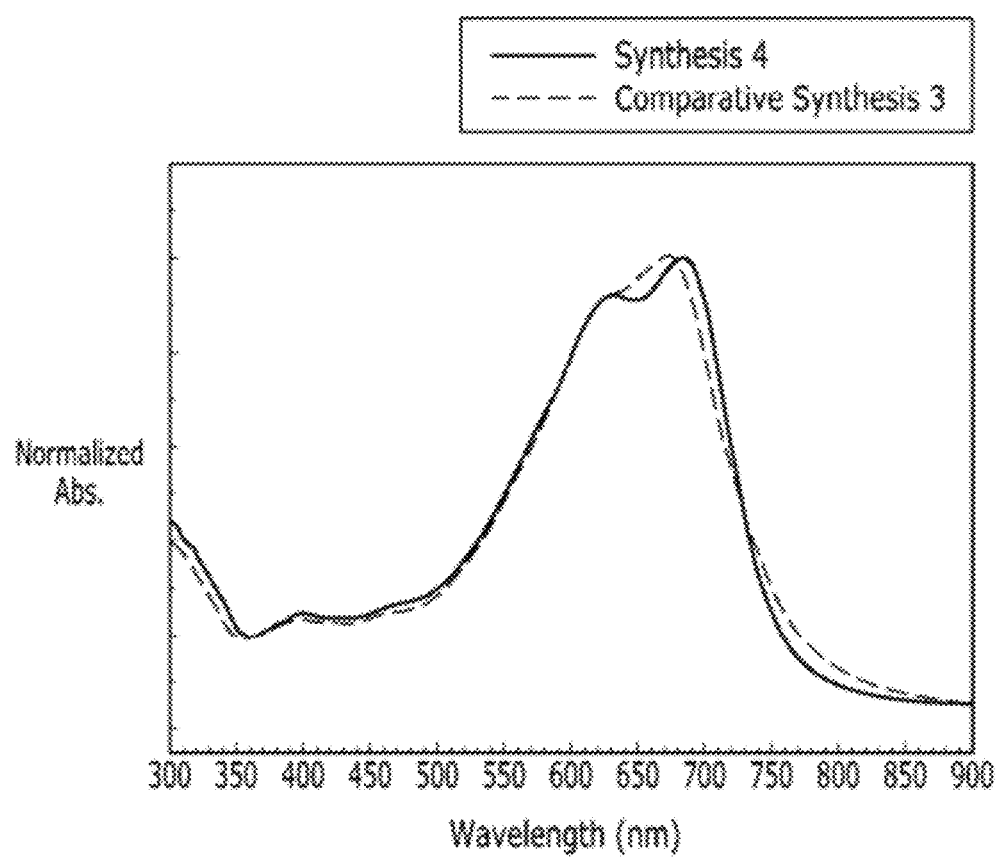
FIG. 5B is the ultraviolet-visible ray (UV-Vis) absorption spectrums of the electron donating polymers according to Synthesis 4 and Comparative Synthesis 3.
Figure 5C:
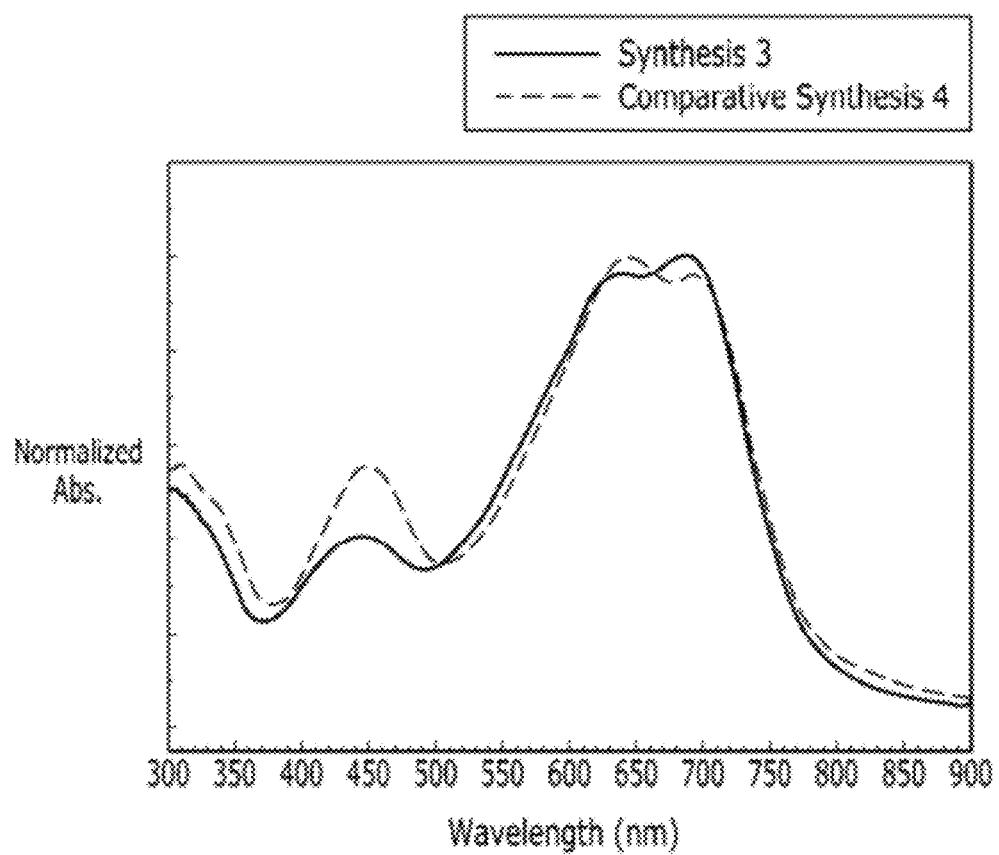
FIG. 5C is the ultraviolet-visible ray (UV-Vis) absorption spectrums of the electron donating polymers according to Synthesis 3 and Comparative Synthesis 4.

FIG. 5A is the ultraviolet-visible ray (UV-Vis) absorption spectrums of the electron donating polymers according to Synthesis 1 and Comparative Synthesis 2, FIG. 5B is the ultraviolet-visible ray (UV-Vis) absorption spectrums of the electron donating polymers according to Synthesis 4 and Comparative Synthesis 3, and FIG. 5C is the ultraviolet-visible ray (UV-Vis) absorption spectrums of the electron donating polymers according to Synthesis 3 and Comparative Synthesis 4.

As shown in FIGS. 5A to 5C, all electron donating polymers according to Syntheses 1, 3 and 4, and Comparative Syntheses 2, 3, and 4 may sufficiently absorb light having a wavelength region of about 500 nm to about 750 nm.

Further, using each electron donating polymer according to Syntheses 1 to 11 and Comparative Syntheses 1 to 4, the external quantum efficiency (EQE) is determined by considering the incident photon to current conversion efficiency (IPCE), which is a ratio of the electron number per unit time which is obtained from the output current with respect to the photon number per unit time which is calculated from the incident short-wavelength light power. The evaluation of EQE is used IQE-200 (manufactured by Newport) equipment.

Figure 6A:
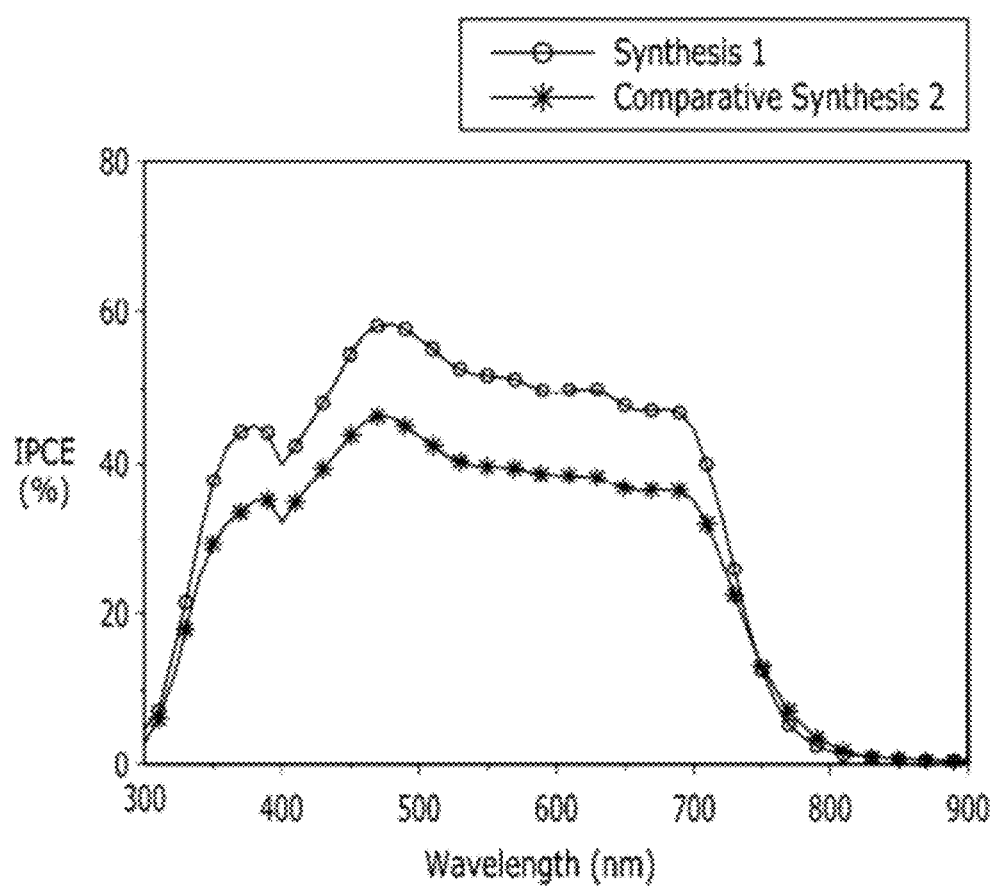
FIG. 6A is an external quantum efficiency graph for the electron donating polymers according to Synthesis 1 and Comparative Synthesis 2.
Figure 6B:
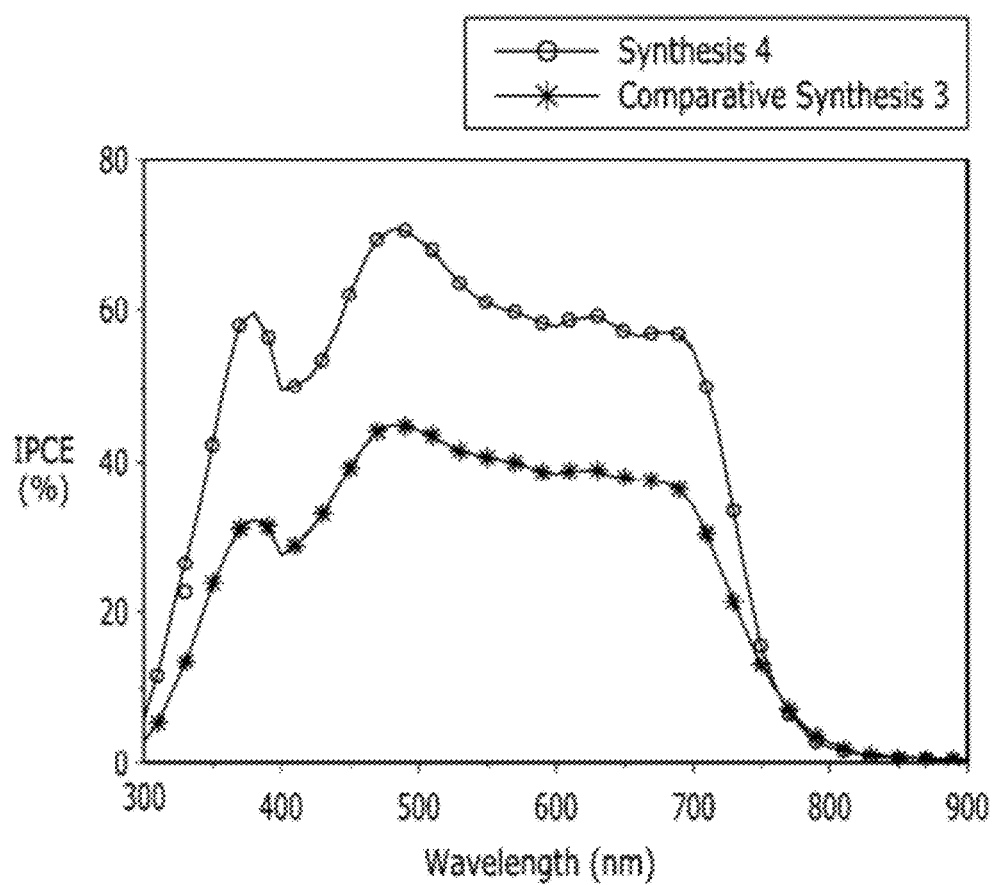
FIG. 6B is an external quantum efficiency graph for the electron donating polymers according to Synthesis 4 and Comparative Synthesis 3.
Figure 6C:
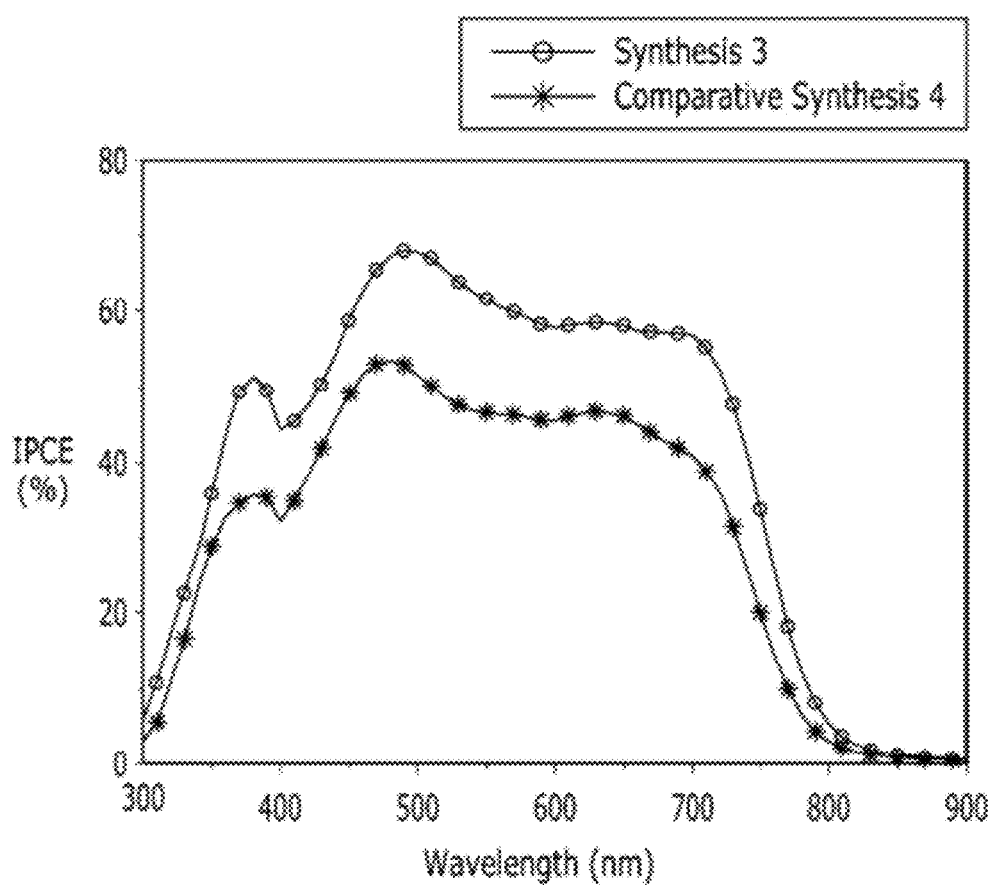
FIG. 6C is an external quantum efficiency graph for the electron donating polymers according to Synthesis 3 and Comparative Synthesis 4.
Figure 7:
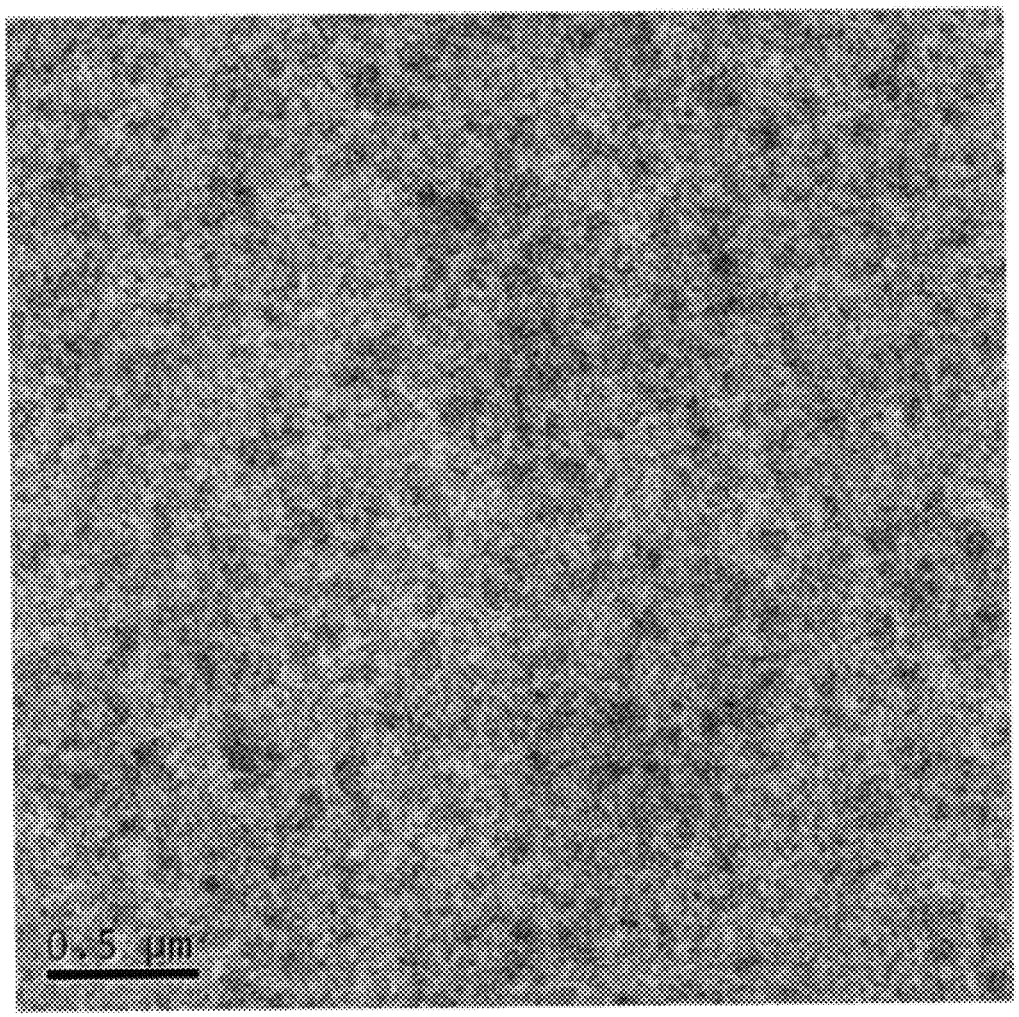
Figure 8:
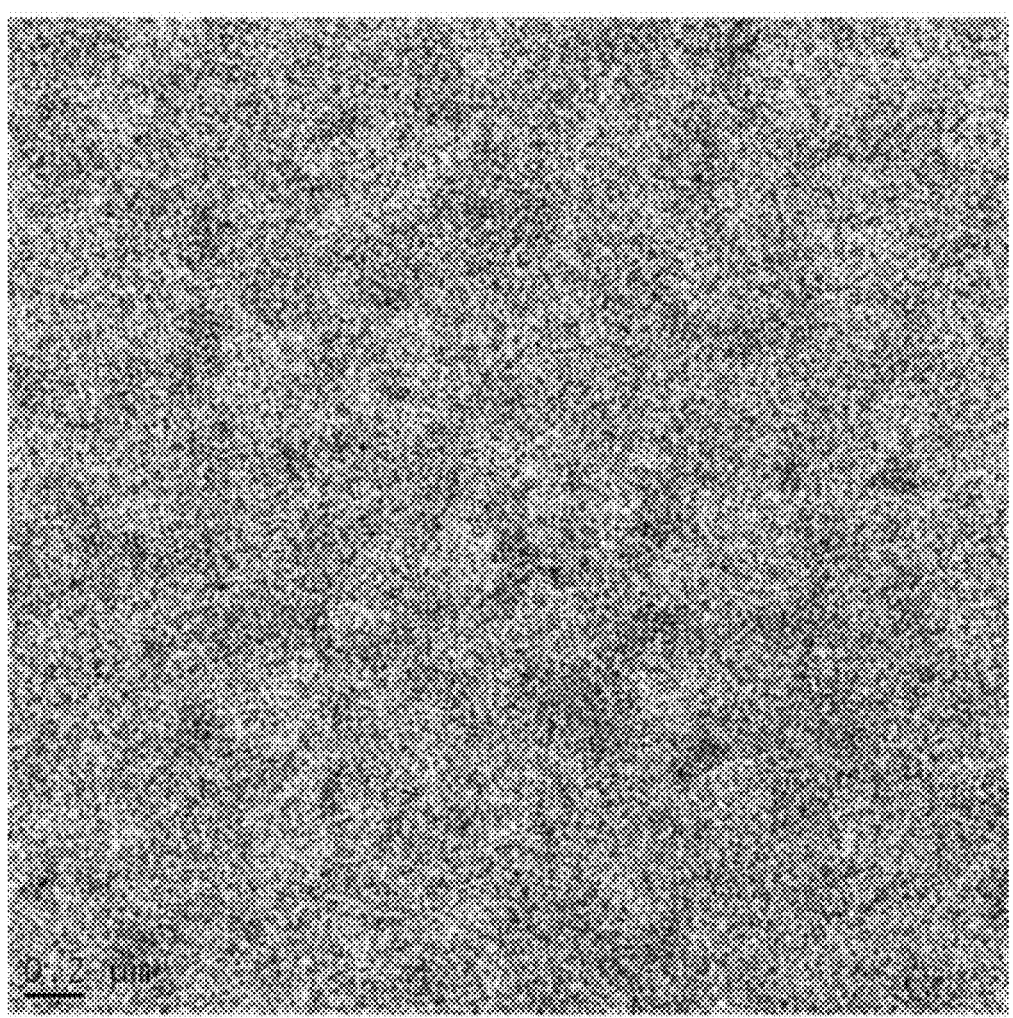
Figure 9:
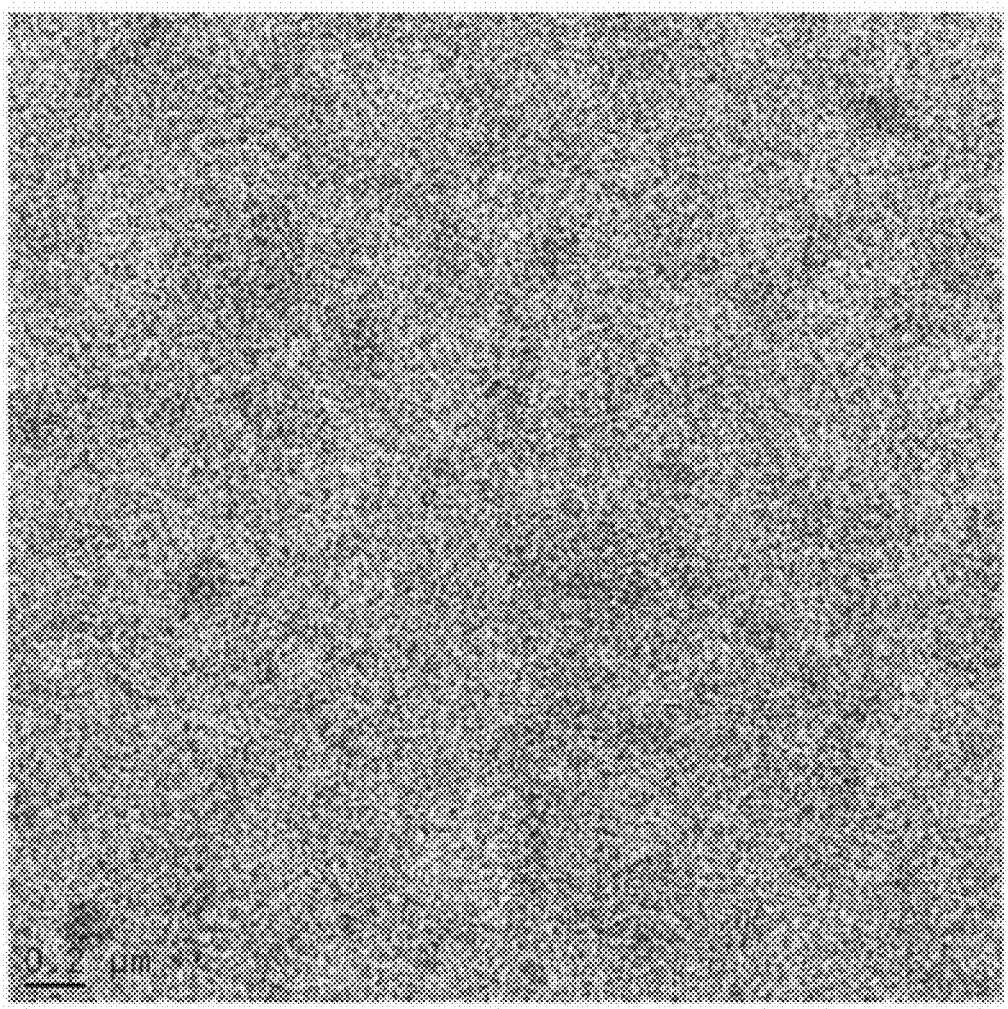
Figure 10:
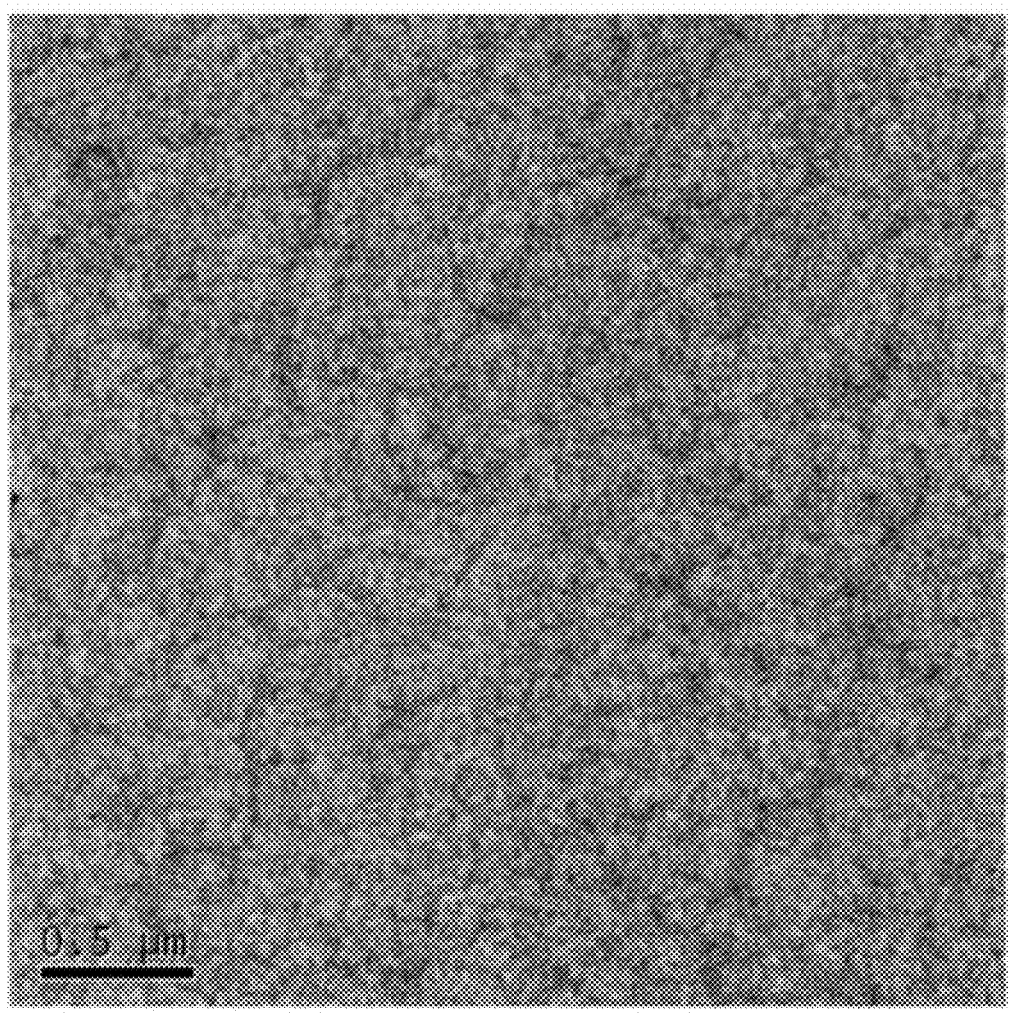
Figure 11:
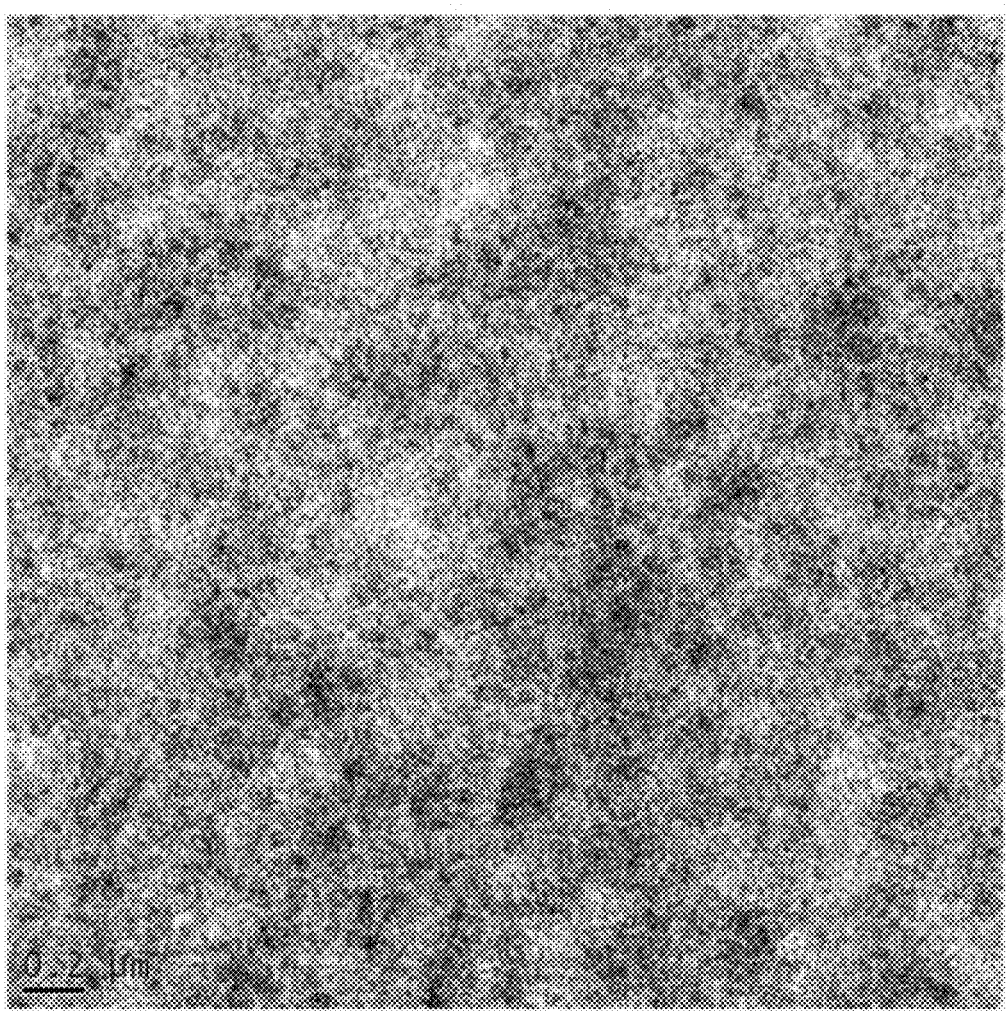
Figure 12:
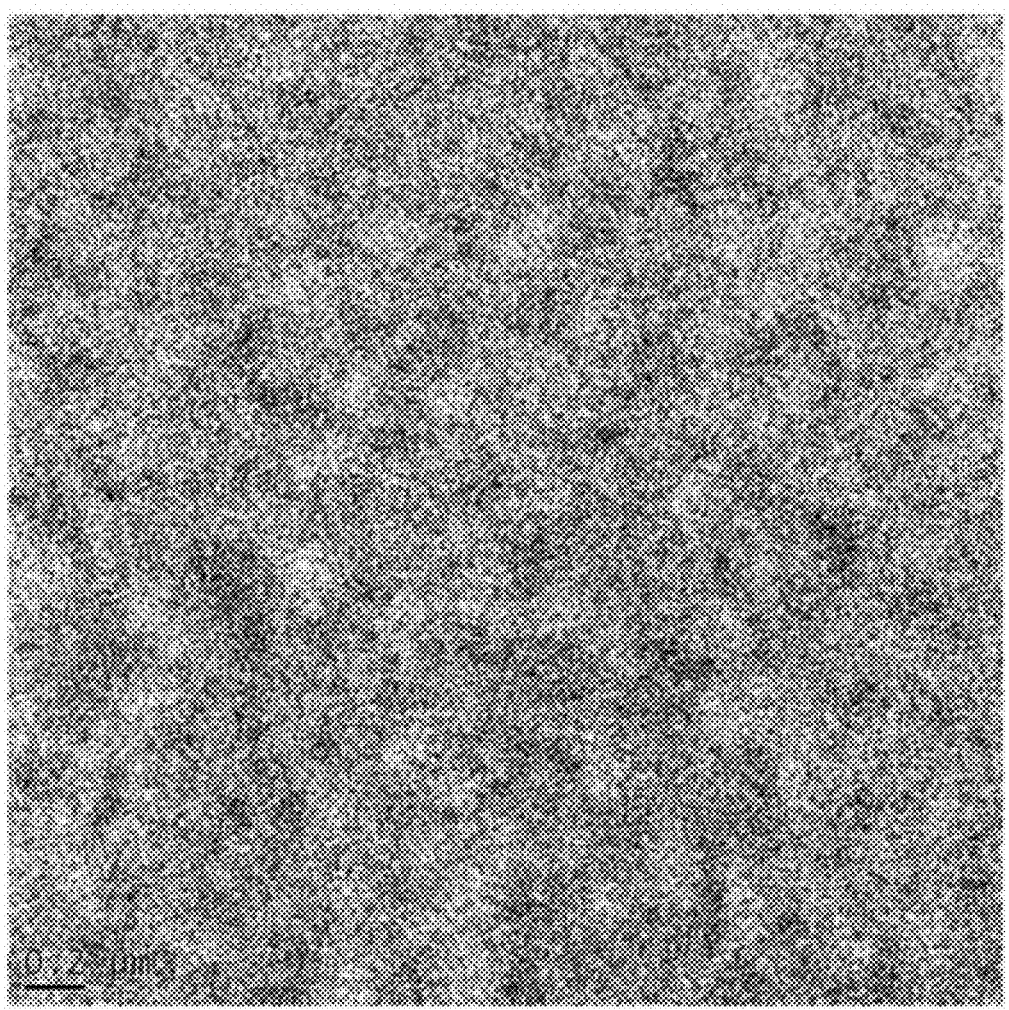

FIG. 6A is an external quantum efficiency graph for the electron donating polymers according to Synthesis 1 and Comparative Synthesis 2, FIG. 6B is an external quantum efficiency graph for the electron donating polymers according to Synthesis 4 and Comparative Synthesis 3, and FIG. 6C is an external quantum efficiency graph for the electron donating polymers according to Synthesis 3 and Comparative Synthesis 4.

As shown in FIGS. 6A to 6C, the electron donating polymers according to Syntheses 1, 4, and 3 have higher external quantum efficiency than the electron donating polymers according to Comparative Syntheses 2, 3, and 4.

Resultantly, while the electron donating polymers according to Syntheses 1, 4, and 3 absorb a similar amount of light to the electron donating polymers according to Comparative Syntheses 2, 3, and 4, the electron donating polymers according to Syntheses 1, 4, and 3 may effectively improve the external quantum efficiency obtained from the absorbed light compared to the electron donating polymers according to Comparative Syntheses 2, 3, and 4.

Evaluation 3: Morphology

The morphologies of the electron donating polymers according to Syntheses 1 to 11 and Comparative Syntheses 1 to 4 are evaluated.

Each the electron donating polymers according to Syntheses 1 to 11 and Comparative Syntheses 1 to 4 is used for an electron donor, and 1-(3-methoxy-carbonyl)propyl-1-phenyl (6,6)C61 (PCBM) is used for an electron acceptor.

About 8 g of each electron donor and about 12 g of the electron acceptor are mixed to provide a mixture. Each mixture is coated on an ITO substrate coated with PEDOT:PSS according to a spin coating method to provide samples.

Each obtained sample is photographed with a transmission electron microscope (TEM) using G2 F30 (manufactured by TECNAI) equipment.

FIGS. 7 to 12 are a TEM photograph of samples using the electron donating polymers according to Syntheses 1, 3, and 4, and Comparative Syntheses 2, 3, and 4, sequentially.

As shown in FIGS. 7 to 12, the case of using the electron donating polymer according to Syntheses 1, 3, and 4 has a smaller domain size and uniform morphology compared to the case of using the electron donating polymer according to Comparative Syntheses 2, 3, and 4.

Fabrication of Solar Cell

Example 1

A transparent glass substrate having a thickness of about 1 mm is prepared. An indium tin oxide (ITO) anode having a thickness of about 150 nm is provided on the transparent glass substrate according to a sputtering method.

A PEDOT:PSS (poly(3,4-ethylenedioxythoiphene): poly (styrenesulfonate)) layer having a thickness of about 30 nm is provided on the ITO anode according to a spin coating method and baked for one hour.

About 8 mg of the electron donating polymer obtained from Synthesis 1 and about 16 mg of C71-PCBM are introduced into about 0.97 ml of chlorobenzene and added with about 0.03 ml of diiodooctane and agitated for about 14 hours to provide a mixture. The mixture is coated on the PEDOT:PSS layer according to a spin coating method (at about 2000 rpm) in a thickness of about 65 nm to provide a photoactive layer. A TiO$_x$ (0<X≤2) interlayer having a thickness of about 7 nm is provided on the photoactive layer and an Al cathode having a thickness of about 80 nm is provided on the interlayer.

Example 2

A solar cell is fabricated in accordance with the same process as in Example 1, except for about 8 mg of the electron donating polymer obtained from Synthesis 2 and about 12 mg of C71-PCBM are introduced, instead of about 8 mg of the electron donating polymer obtained from Synthesis 1 and about 16 mg of C71-PCBM.

Example 3

A solar cell is fabricated in accordance with the same process as in Example 1, except for about 8 mg of the electron donating polymer obtained from Synthesis 3 and about 12 mg of C71-PCBM are introduced, instead of about 8 mg of the electron donating polymer obtained from Synthesis 1 and about 16 mg of C71-PCBM.

Example 4

A solar cell is fabricated in accordance with the same process as in Example 1, except for about 8 mg of the electron donating polymer obtained from Synthesis 4 and about 12 mg of C71-PCBM are introduced, instead of about 8 mg of the electron donating polymer obtained from Synthesis 1 and about 16 mg of C71-PCBM.

Example 5

A solar cell is fabricated in accordance with the same process as in Example 1, except for about 8 mg of the electron donating polymer obtained from Synthesis 5 and about 12 mg of C71-PCBM are introduced, instead of about 8 mg of the electron donating polymer obtained from Synthesis 1 and about 16 mg of C71-PCBM.

Example 6

A solar cell is fabricated in accordance with the same process as in Example 1, except for about 8 mg of the electron donating polymer obtained from Synthesis 6 and about 12 mg of C71-PCBM are introduced, instead of about 8 mg of the electron donating polymer obtained from Synthesis 1 and about 16 mg of C71-PCBM.

Example 7

A solar cell is fabricated in accordance with the same process as in Example 1, except for about 8 mg of the electron donating polymer obtained from Synthesis 7 and about 12 mg of C71-PCBM are introduced, instead of about 8 mg of the electron donating polymer obtained from Synthesis 1 and about 16 mg of C71-PCBM.

Example 8

A solar cell is fabricated in accordance with the same process as in Example 1, except for about 8 mg of the electron donating polymer obtained from Synthesis 8 and about 12 mg of C71-PCBM are introduced, instead of about 8 mg of the electron donating polymer obtained from Synthesis 1 and about 16 mg of C71-PCBM.

Example 9

A solar cell is fabricated in accordance with the same process as in Example 1, except for about 8 mg of the electron donating polymer obtained from Synthesis 9 and about 12 mg of C71-PCBM are introduced, instead of about 8 mg of the electron donating polymer obtained from Synthesis 1 and about 16 mg of C71-PCBM.

Example 10

A solar cell is fabricated in accordance with the same process as in Example 1, except for about 8 mg of the electron donating polymer obtained from Synthesis 10 and about 12 mg of C71-PCBM are introduced, instead of about 8 mg of the electron donating polymer obtained from Synthesis 1 and about 16 mg of C71-PCBM.

Example 11

A solar cell is fabricated in accordance with the same process as in Example 1, except for about 8 mg of the electron donating polymer obtained from Synthesis 11 and about 12 mg of C71-PCBM are introduced, instead of about 8 mg of the electron donating polymer obtained from Synthesis 1 and about 16 mg of C71-PCBM.

Comparative Example 1

A solar cell is fabricated in accordance with the same process as in Example 1, except for about 20 mg of the electron donating polymer obtained from Comparative Synthesis 1 and about 20 mg of C71-PCBM are introduced, instead of about 8 mg of the electron donating polymer obtained from Synthesis 1 and about 16 mg of C71-PCBM.

Comparative Example 2

A solar cell is fabricated in accordance with the same process as in Example 1, except for about 8 mg of the electron donating polymer obtained from Comparative Synthesis 2 and about 8 mg of C71-PCBM are introduced, instead of about 8 mg of the electron donating polymer obtained from Synthesis 1 and about 16 mg of C71-PCBM.

Comparative Example 3

A solar cell is fabricated in accordance with the same process as in Example 1, except for about 8 mg of the electron donating polymer obtained from Comparative Synthesis 3 and about 12 mg of C71-PCBM are introduced, instead of about 8 mg of the electron donating polymer obtained from Synthesis 1 and about 16 mg of C71-PCBM.

Comparative Example 4

A solar cell is fabricated in accordance with the same process as in Example 1, except for about 8 mg of the electron donating polymer obtained from Comparative Synthesis 4 and about 8 mg of C71-PCBM are introduced, instead of about 8 mg of the electron donating polymer obtained from Synthesis 1 and about 16 mg of C71-PCBM.

Evaluation of Solar Cell Properties
Evaluation 4

The solar cells obtained from Examples 1 to 11 and Comparative Examples 1 to 4 are measured for the photocurrent voltage, and the open-circuit voltage (Voc), the short-circuit current (Jsc), and the fill factor (FF) are calculated from the photocurrent curve. In addition, the efficiency of a solar cell is evaluated from the same.

A xenon lamp (Oriel, 01193) is used for a light source, and the solar condition (AM 1.5) of the xenon lamp is compensated for using a standard solar cell (Fraunhofer Institute for Solar Energy Systems, Certificate No. C-ISE369, Type of material: Mono-Si+KG filter).

The results are shown in the following Table 1 and FIG. 13.

Figure 13:
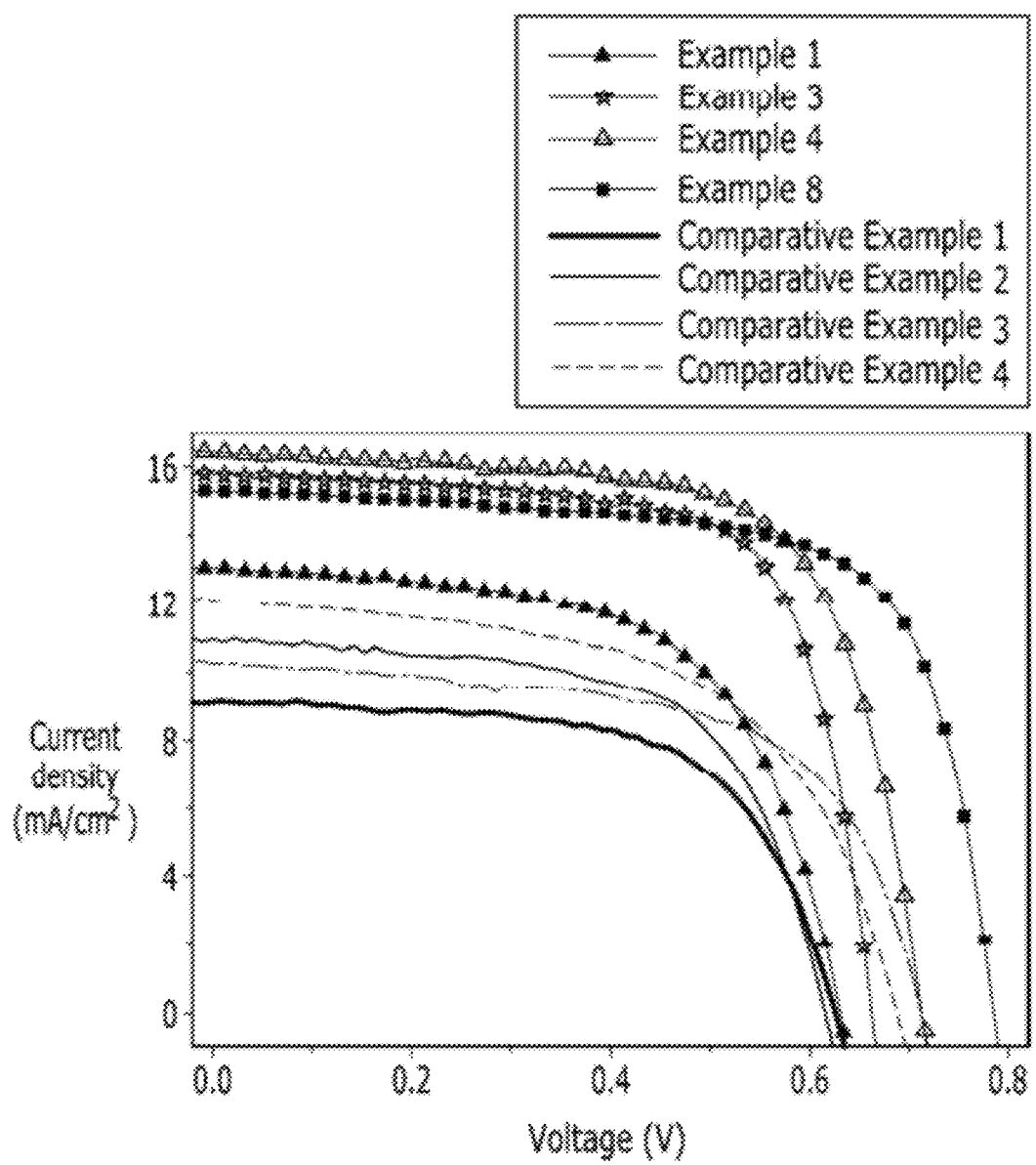

FIG. 13 illustrates the photocurrent curves of the solar cells according to Examples 1, 3-4 and 8 and Comparative Examples 1, 2, 3 and 4.

TABLE 1

| | Voc (mV) | $J_{sc}$ (mA/cm$^2$) | FF (%) | Efficiency (%) |
|---|---|---|---|---|
| Example 1 | 635.4 | 13.1 | 59.9 | 5.0 |
| Example 2 | 675.6 | 13.7 | 64.2 | 5.9 |
| Example 3 | 665.5 | 15.8 | 70.1 | 7.4 |
| Example 4 | 715.8 | 16.4 | 68.0 | 8.0 |
| Example 5 | 675.6 | 13.5 | 60.7 | 5.5 |
| Example 6 | 685.6 | 15.0 | 58.2 | 6.0 |
| Example 7 | 715.8 | 14.6 | 57.4 | 6.0 |
| Example 8 | 786.2 | 15.3 | 69.6 | 8.4 |
| Example 9 | 705.7 | 14.7 | 61.3 | 6.4 |
| Example 10 | 715.8 | 13.4 | 61.4 | 5.9 |
| Example 11 | 695.7 | 13.3 | 59.6 | 5.5 |
| Comparative Example 1 | 615.2 | 9.2 | 63.6 | 3.6 |
| Comparative Example 2 | 618.2 | 10.9 | 62.2 | 4.19 |
| Comparative Example 3 | 709.1 | 10.2 | 61.6 | 4.46 |
| Comparative Example 4 | 685.6 | 12.1 | 57.0 | 4.7 |

As shown in FIG. 13 and Table 1, the solar cells obtained from Examples 1 to 11 have improved current density and efficiency when compared with the solar cells obtained from Comparative Examples 1 to 4.

While this disclosure has been described in connection with what is presently considered to be practical example embodiments, it is to be understood that the inventive concepts are not limited to the disclosed embodiments, but, on the contrary, are intended to cover various modifications and equivalent arrangements included within the spirit and scope of the appended claims.

What is claimed is:

1. A polymer including a moiety A represented by the Chemical Formula 1:

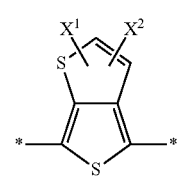

[Chemical Formula 1]

wherein, in Chemical Formula 1, $X^1$ is a functional group including at least two ester residual groups and a substituted or unsubstituted divalent aliphatic group linking the ester residual groups, and $X^2$ is one of hydrogen, a halogen atom, a substituted or unsubstituted $C_1$ to $C_{20}$ aliphatic group, a hydroxy group, a substituted or unsubstituted $C_1$ to $C_{20}$ alkoxy group, a substituted or unsubstituted $C_1$ to $C_{30}$ ketone group, a substituted or unsubstituted $C_1$ to $C_{20}$ ester group, a thiol group, —SR$^{100}$ (wherein R$^{100}$ is one of a substituted or unsubstituted C$_1$ to C$_{20}$ aliphatic group, a substituted or unsubstituted C$_2$ to C$_{30}$ aromatic group, and a substituted or unsubstituted C$_2$ to C$_{30}$ heterocycloalkyl group), and a combination thereof.

2. The polymer of claim 1, wherein X$^1$ is a functional group represented by the Chemical Formula 1A or 1B:

[Chemical Formula 1A]

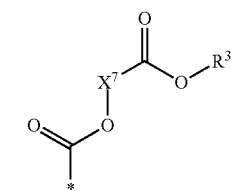

[Chemical Formula 1B]

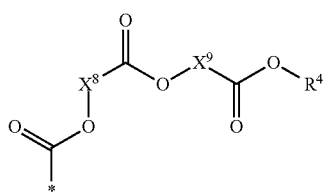

wherein, in Chemical Formula 1A or 1B,
each of X$^7$ to X$^9$ are the same or different and are independently a substituted or unsubstituted divalent C$_1$ to C$_{20}$ aliphatic group, and
each of R$^3$ and R$^4$ are the same or different and are independently one of hydrogen and a substituted or unsubstituted C$_1$ to C$_{20}$ aliphatic group.

3. The polymer of claim 1, wherein at least one of X$^1$ and X$^2$ includes a halogen atom.

4. The polymer of claim 1, further comprising:
a moiety B represented by the Chemical Formula 2:

[Chemical Formula 2]

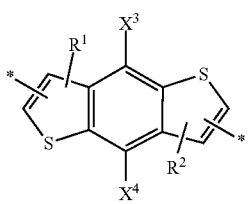

wherein, in the Chemical Formula 2,
each of X$^3$ and X$^4$ are the same or different and are independently one of hydrogen, a halogen atom, a substituted or unsubstituted C$_1$ to C$_{20}$ aliphatic group, a hydroxy group, a substituted or unsubstituted C$_1$ to C$_{20}$ alkoxy group, a substituted or unsubstituted C$_1$ to C$_{20}$ ketone group, a substituted or unsubstituted C$_1$ to C$_{20}$ ester group, a thiol group, —SR$^{101}$ (wherein R$^{101}$ is one of a substituted or unsubstituted C$_1$ to C$_{20}$ aliphatic group, a substituted or unsubstituted C$_2$ to C$_{30}$ aromatic group, and a substituted or unsubstituted C$_2$ to C$_{30}$ heterocycloalkyl group), and a combination thereof, and
each of R$^1$ and R$^2$ are the same or different and are independently one of hydrogen, a substituted or unsubstituted C$_1$ to C$_{20}$ alkyl group, a substituted or unsubstituted C$_3$ to C$_{20}$ cycloalkyl group, a substituted or unsubstituted C$_1$ to C$_{20}$ alkoxy group, a substituted or unsubstituted C$_6$ to C$_{30}$ aryl group, a substituted or unsubstituted C$_2$ to C$_{30}$ heteroaryl group, an organic group including at least one of —O—, —S—, —SO$_2$—, —CO—, —OCO—, —COO—, —CH=CH—, —C≡C—, and —SiR$^{102}$R$^{103}$ (wherein R$^{102}$ and R$^{103}$ are the same or different and are each one of independently hydrogen, a substituted or unsubstituted C$_1$ to C$_{20}$ alkyl group, a substituted or unsubstituted C$_3$ to C$_{20}$ cycloalkyl group, a substituted or unsubstituted C$_1$ to C$_{20}$ alkoxy group, a substituted or unsubstituted C$_6$ to C$_{30}$ aryl group, a substituted or unsubstituted C$_2$ to C$_{30}$ heteroaryl group, and a combination thereof), and a combination thereof.

5. The polymer of claim 4, wherein the moiety A and the moiety B are included at a mole ratio of about 1:0.5 to about 1:2.5.

6. The polymer of claim 4, wherein the moiety A and the moiety B form a repeating unit, and
the repeating unit includes one of a repeating unit represented by the Chemical Formula 3, a repeating unit represented by the Chemical Formula 4, and a combination thereof:

[Chemical Formula 3]

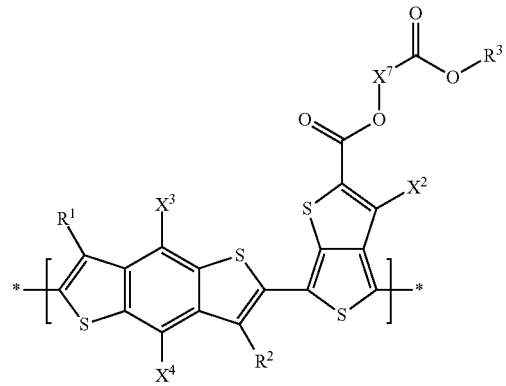

[Chemical Formula 4]

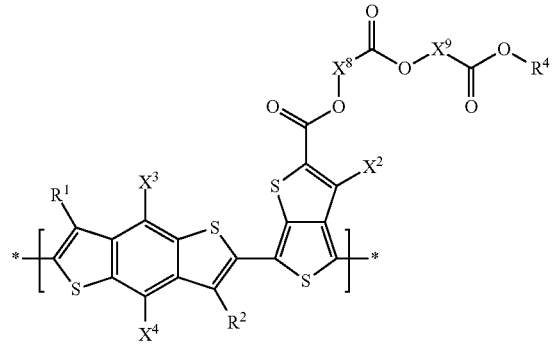

wherein, in the Chemical Formulae 3 and 4,
X$^2$ is one of hydrogen, a halogen atom, a substituted or unsubstituted C$_1$ to C$_{20}$ alkyl group, and a combination thereof, each of $X^3$ and $X^4$ are the same or different and are independently a substituted or unsubstituted $C_1$ to $C_{20}$ alkyl group, a substituted or unsubstituted $C_1$ to $C_{20}$ alkoxy group, and $-SR^{101}$ (wherein $R^{101}$ is a substituted or unsubstituted $C_1$ to $C_{20}$ alkyl group), each of $X^7$ to $X^9$ are the same or different and are independently a substituted or unsubstituted divalent $C_1$ to $C_{10}$ aliphatic group, each of $R^1$ and $R^2$ are the same or different and are independently one of hydrogen and a substituted or unsubstituted $C_1$ to $C_{10}$ alkyl group, and each of $R^3$ and $R^4$ are the same or different and are independently one of hydrogen and a substituted or unsubstituted $C_1$ to $C_{10}$ aliphatic group.

7. The polymer of claim 1, further comprising:
a moiety C represented by the Chemical Formula 5:

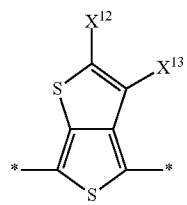

[Chemical Formula 5]

wherein, in the Chemical Formula 5,
each of $X^{12}$ and $X^{13}$ are the same or different and are independently one of hydrogen, a halogen atom, a substituted or unsubstituted $C_1$ to $C_{20}$ alkyl group, a substituted or unsubstituted $C_3$ to $C_{20}$ cycloalkyl group, a substituted or unsubstituted $C_6$ to $C_{30}$ aryl group, a substituted or unsubstituted $C_2$ to $C_{30}$ heteroaryl group, a substituted or unsubstituted $C_1$ to $C_{20}$ alkoxy group, a substituted or unsubstituted $C_1$ to $C_{30}$ ketone group, a substituted or unsubstituted $C_1$ to $C_{20}$ ester group, and a combination thereof.

8. The polymer of claim 7, wherein at least one of $X^{12}$ and $X^{13}$ includes a halogen atom.

9. The polymer of claim 7, further comprising:
a moiety D represented by the Chemical Formula 6:

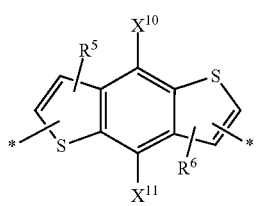

[Chemical Formula 6]

wherein, in the Chemical Formula 6,
each of $X^{10}$ and $X^{11}$ are the same or different and are independently one of hydrogen, a halogen atom, a substituted or unsubstituted $C_1$ to $C_{20}$ aliphatic group, a hydroxy group, a substituted or unsubstituted $C_1$ to $C_{20}$ alkoxy group, a substituted or unsubstituted $C_1$ to $C_{20}$ ketone group, a substituted or unsubstituted $C_1$ to $C_{20}$ ester group, a thiol group, $-SR^{104}$ (wherein $R^{104}$ is one of a substituted or unsubstituted $C_1$ to C20 aliphatic group, a substituted or unsubstituted $C_2$ to $C_{30}$ aromatic group, and a substituted or unsubstituted $C_2$ to $C_{30}$ heterocycloalkyl group), and a combination thereof, and each of $R^5$ and $R^6$ are the same or different and are independently one of hydrogen, a substituted or unsubstituted $C_1$ to $C_{20}$ alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, an organic group including at least one of $-O-$, $-S-$, $-SO_2-$, $-CO-$, $-OCO-$, $-COO-$, $-CH=CH-$, $-C\equiv C-$, and $-SiR^{105}R^{106}$ (wherein $R^{105}$ and $R^{106}$ are the same or different and are each independently one of hydrogen, a substituted or unsubstituted $C_1$ to $C_{20}$ alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, and a combination thereof), and a combination thereof.

10. The polymer of claim 9, wherein the moiety C and the moiety D form a repeating unit, and the repeating unit includes a repeating unit represented by the Chemical Formula 7:

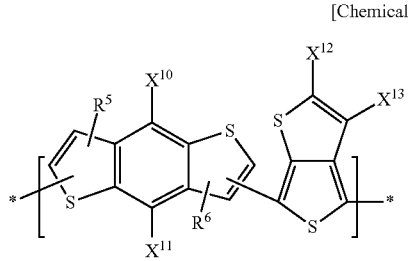

[Chemical Formula 7]

wherein, in Chemical Formula 7,
each of $X^{10}$ and $X^{11}$ are the same or different and are independently one of hydrogen and a substituted or unsubstituted $C_1$ to $C_{20}$ alkoxy group, each of $X^{12}$ and $X^{13}$ are the same or different and are independently one of hydrogen, a halogen atom, a substituted or unsubstituted $C_1$ to $C_{20}$ ketone group, and a substituted or unsubstituted $C_1$ to $C_{20}$ aryl group, and each of $R^5$ and $R^6$ are the same or different and are independently one of hydrogen and a substituted or unsubstituted $C_1$ to $C_{20}$ alkyl group.

11. The polymer of claim 1, wherein the polymer includes one of a copolymer represented by the Chemical Formula 8, a copolymer represented by the Chemical Formula 9, and a combination thereof:

[Chemical Formula 8]

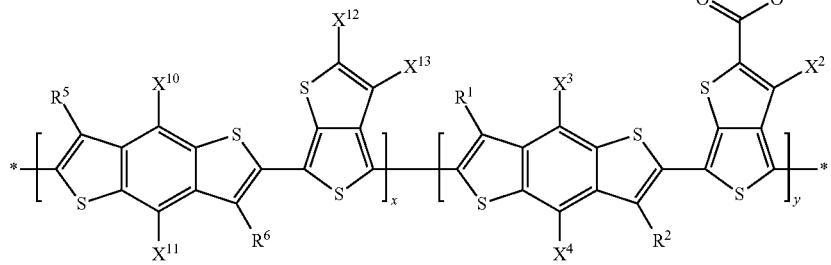

[Chemical Formula 9]

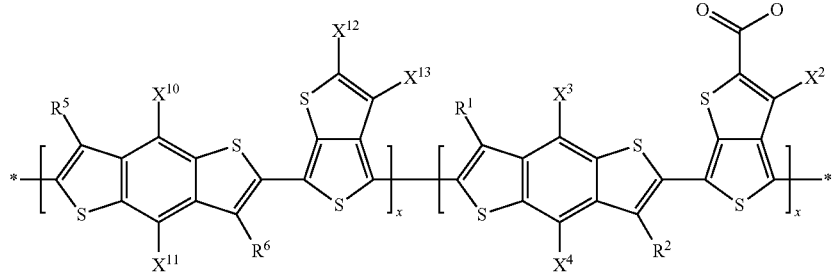

wherein, in Chemical Formulae 8 and 9, $X^2$ is one of hydrogen, a halogen atom, and a substituted or unsubstituted $C_1$ to $C_{20}$ alkyl group, each of $X^3$ and $X^4$ are the same or different and are independently one of a substituted or unsubstituted $C_1$ to $C_{20}$ alkyl group, a substituted or unsubstituted $C_1$ to $C_{20}$ alkoxy group, and —$SR^{101}$ (wherein $R^{101}$ is a substituted or unsubstituted $C_1$ to $C_{20}$ alkyl group), each of $X^7$ to $X^9$ are the same or different and are independently a substituted or unsubstituted divalent $C_1$ to $C_{10}$ aliphatic group, each of $X^{10}$ and $X^{11}$ are the same or different and are independently one of hydrogen and a substituted or unsubstituted $C_1$ to $C_{20}$ alkoxy group, each of $X^{12}$ and $X^{13}$ are the same or different and are independently one of hydrogen, a halogen atom, a substituted or unsubstituted $C_1$ to $C_{30}$ ketone group, and a substituted or unsubstituted $C_1$ to $C_{30}$ aryl group, each of $R^1$ to $R^6$ are the same or different and are independently one of hydrogen and a substituted or unsubstituted $C_1$ to $C_{10}$ alkyl group, x and y are each a mole ratio and satisfy the following equations: $0 \leq x \leq 10$ and $0 < y \leq 10$.

12. The polymer of claim 11, wherein at least one of $X^2$, $X^{12}$ and $X^{13}$ includes a halogen atom.

13. The polymer of claim 1, wherein the polymer has a bandgap of about 1.2 eV to about 2.5 eV.

14. A solar cell comprising:
an anode and a cathode facing each other; and
a photoactive layer between the anode and the cathode, the solar cell including an electron donor and an electron acceptor, wherein the electron donor includes a polymer including a moiety A represented by Chemical Formula 1:

[Chemical Formula 1]

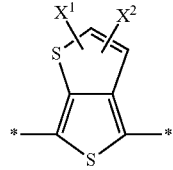

wherein, in Chemical Formula 1, $X^1$ is a functional group including at least two ester residual groups and a substituted or unsubstituted divalent aliphatic organic group linking the ester residual groups, and $X^2$ is one of hydrogen, a halogen atom, a substituted or unsubstituted $C_1$ to $C_{20}$ aliphatic group, a hydroxy group, a substituted or unsubstituted $C_1$ to $C_{20}$ alkoxy group, a substituted or unsubstituted $C_1$ to $C_{30}$ ketone group, a substituted or unsubstituted $C_1$ to $C_{20}$ ester group, a thiol group, —$SR^{100}$ (wherein $R^{100}$ is one of a substituted or unsubstituted $C_1$ to $C_{20}$ aliphatic group, a substituted or unsubstituted $C_2$ to $C_{30}$ aromatic group, and a substituted or unsubstituted $C_2$ to $C_{30}$ heterocycloalkyl group), and a combination thereof.

15. The solar cell of claim 14, wherein the polymer further comprises a moiety B represented by the Chemical Formula 2:

[Chemical Formula 2]

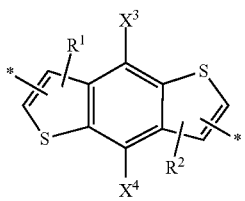

wherein, in the Chemical Formula 2,
each of $X^3$ and $X^4$ are the same or different and are independently one of hydrogen, a halogen atom, a substituted or unsubstituted $C_1$ to $C_{20}$ aliphatic group, a hydroxy group, a substituted or unsubstituted $C_1$ to $C_{20}$ alkoxy group, a substituted or unsubstituted $C_1$ to $C_{20}$ ketone group, a substituted or unsubstituted $C_1$ to $C_{20}$ ester group, a thiol group, —$SR^{101}$ (wherein $R^{101}$ is one of a substituted or unsubstituted $C_1$ to $C_{20}$ aliphatic group, a substituted or unsubstituted $C_2$ to $C_{30}$ aromatic group, and a substituted or unsubstituted $C_2$ to $C_{30}$ heterocycloalkyl group), and a combination thereof, and each of $R^1$ and $R^2$ are the same or different and are independently one of hydrogen, a substituted or unsubstituted $C_1$ to $C_{20}$ alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, an organic group including at least one of —O—, —S—, —$SO_2$—, —CO—, —OCO—, —COO—, —CH=CH—, —C≡C—, and —$SiR^{102}R^{103}$ (wherein $R^{102}$ and $R^{103}$ are the same or different and are each independently one of hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, and a combination thereof), and a combination thereof.

16. The solar cell of claim 15, wherein the polymer includes a repeating unit including the moiety A and the moiety B, and
the repeating unit is one of a repeating unit represented by the Chemical Formula 3, a repeating unit represented by the Chemical Formula 4, and a combination thereof:

[Chemical Formula 3]

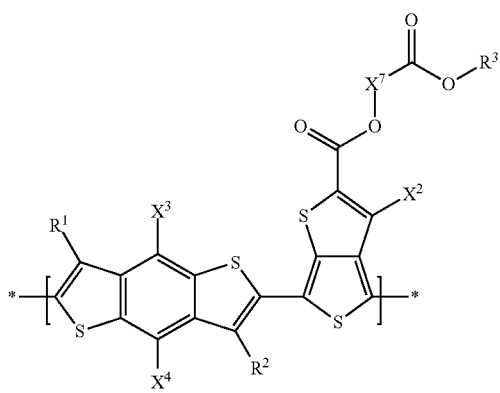

[Chemical Formula 4]

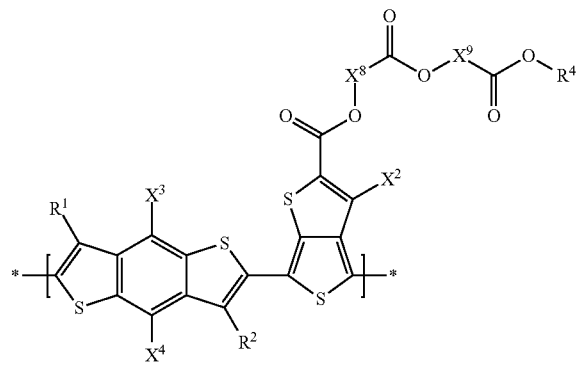

wherein, in the Chemical Formulae 3 and 4,
$X^2$ is independently one of hydrogen, a halogen atom, a substituted or unsubstituted $C_1$ to $C_{20}$ alkyl group, and a combination thereof,
each of $X^3$ and $X^4$ are the same or different and are independently one of a substituted or unsubstituted $C_1$ to $C_{20}$ alkyl group, a substituted or unsubstituted $C_1$ to $C_{20}$ alkoxy group, and —$SR^{101}$ (wherein $R^{101}$ is a substituted or unsubstituted $C_1$ to $C_{20}$ alkyl group),
each of $X^7$ to $X^9$ are the same or different and are independently a substituted or unsubstituted divalent $C_1$ to $C_{10}$ aliphatic group,
each of $R^1$ and $R^2$ are the same or different and are independently one of hydrogen and a substituted or unsubstituted $C_1$ to $C_{10}$ alkyl group, and
each of $R^3$ and $R^4$ are the same or different and are independently one of hydrogen and a substituted or unsubstituted $C_1$ to $C_{10}$ aliphatic group.

17. The solar cell of claim 16, wherein the polymer further comprises a repeating unit represented by the Chemical Formula 7:

[Chemical Formula 7]

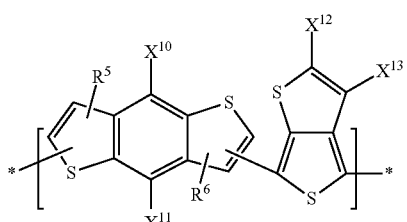

wherein, in Chemical Formula 7,
each of $X^{10}$ and $X^{11}$ are the same or different and are independently one of hydrogen, and a substituted or unsubstituted $C_1$ to $C_{20}$ alkoxy group,
each of $X^{12}$ and $X^{13}$ are the same or different and are independently one of hydrogen, a halogen atom, a substituted or unsubstituted $C_1$ to $C_{20}$ ketone group, and a substituted or unsubstituted $C_1$ to $C_{20}$ aryl group, and
each of $R^5$ and $R^6$ are the same or different and are independently one of hydrogen, and a substituted or unsubstituted $C_1$ to $C_{20}$ alkyl group.

18. The solar cell of claim 14, wherein the polymer includes one of a copolymer represented by the Chemical Formula 8, a copolymer represented by the Chemical Formula 9, and a combination thereof:

[Chemical Formula 8]

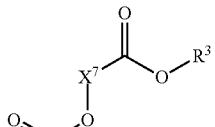
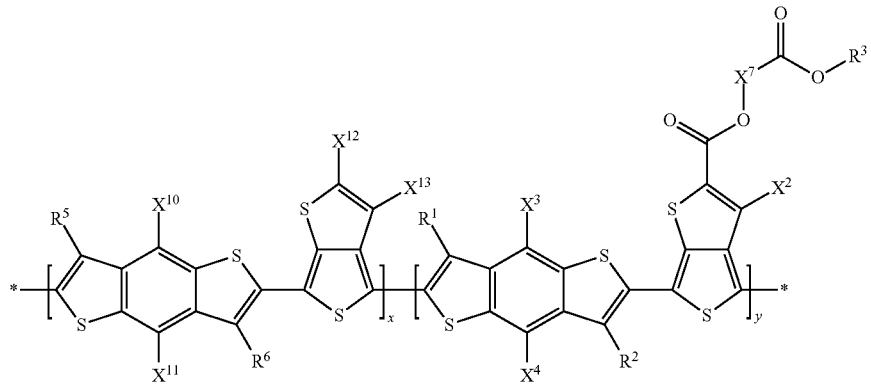

[Chemical Formula 9]

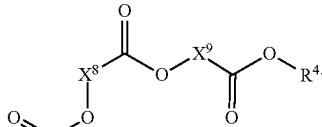
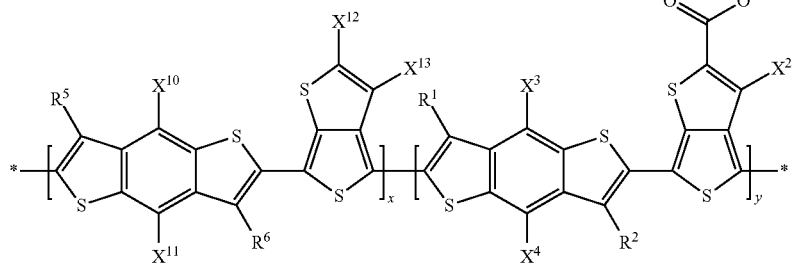

wherein, in Chemical Formulae 8 and 9, $X^2$ is one of hydrogen, a halogen atom, and a substituted or unsubstituted $C_1$ to $C_{20}$ alkyl group, each of $X^3$ and $X^4$ are the same or different and are independently one of a substituted or unsubstituted $C_1$ to $C_{20}$ alkyl group, a substituted or unsubstituted $C_1$ to $C_{20}$ alkoxy group, and —$SR^{101}$ (wherein $R^{101}$ is a substituted or unsubstituted $C_1$ to $C_{20}$ alkyl group), each of $X^7$ to $X^9$ are the same or different and are independently a substituted or unsubstituted divalent $C_1$ to $C_{10}$ aliphatic group, each of $X^{10}$ and $X^{11}$ are the same or different and are independently one of hydrogen and a substituted or unsubstituted $C_1$ to $C_{20}$ alkoxy group, each of $X^{12}$ and $X^{13}$ are the same or different and are independently one of hydrogen, a halogen atom, a substituted or unsubstituted $C_1$ to $C_{20}$ ketone group, and a substituted or unsubstituted $C_1$ to $C_{20}$ aryl group, each of $R^1$ to $R^6$ are the same or different and are independently one of hydrogen and a substituted or unsubstituted $C_1$ to $C_{10}$ alkyl group, x and y are each a mole ratio and satisfy the following equations: $0 \le x \le 10$ and $0 < y \le 10$.

19. The solar cell of claim 18, wherein at least one of $X^2$, $X^{12}$, and $X^{13}$ includes a halogen atom.

20. The solar cell of claim 16, wherein the electron acceptor includes one of a fullerene and a fullerene derivative.

21. The solar cell of claim 20, wherein the electron acceptor includes one of C60, C70, C74, C76, C78, C82, C84, C720, C860, 1-(3-methoxy-carbonyl)propyl-1-phenyl(6,6)C61 (PCBM), C71-PCBM, C84-PCBM, bis-PCBM and a combination thereof.

22. The solar cell of claim 14, wherein one of the cathode and the anode includes one of indium tin oxide (ITO), indium-doped zinc oxide (IZO), tin oxide ($SnO_2$), aluminum-doped zinc oxide (AZO), and gallium-doped zinc oxide (GZO), and the other of the cathode and the anode includes one of aluminum (Al), silver (Ag), gold (Au), and lithium (Li).

23. The solar cell of claim 14, wherein the polymer has a number average molecular weight in a range of about 1,000 to about 800,000.

24. The solar cell of claim 23, wherein the polymer has a number average molecular weight in a range of about 2,000 to about 100,000.

25. The solar cell of claim 14, wherein the polymer has a bandgap in a range of about 1.2 eV to about 2.5 eV.

* * * * *